United States Patent
Sudhakaran

(10) Patent No.: US 12,132,590 B2
(45) Date of Patent: Oct. 29, 2024

(54) HARDWARE-EFFICIENT PAM-3 ENCODER AND DECODER

(71) Applicant: NVIDIA Corp., Santa Clara, CA (US)

(72) Inventor: Sunil Sudhakaran, Brisbane, CA (US)

(73) Assignee: NVIDIA, Corp., Santa Clara, CA (US)

( * ) Notice: Subject to any disclaimer, the term of this patent is extended or adjusted under 35 U.S.C. 154(b) by 138 days.

(21) Appl. No.: 17/931,062

(22) Filed: Sep. 9, 2022

(65) Prior Publication Data

US 2023/0327924 A1   Oct. 12, 2023

Related U.S. Application Data

(60) Provisional application No. 63/330,315, filed on Apr. 13, 2022, provisional application No. 63/329,838, filed on Apr. 11, 2022, provisional application No. 63/328,172, filed on Apr. 6, 2022, provisional application No. 63/321,534, filed on Mar. 18, 2022.

(51) Int. Cl.
*H04L 25/49*   (2006.01)
*H03M 13/00*   (2006.01)
*H03M 13/11*   (2006.01)
*H04L 1/00*   (2006.01)

(52) U.S. Cl.
CPC ..... *H04L 25/4917* (2013.01); *H03M 13/1111* (2013.01); *H03M 13/611* (2013.01); *H04L 1/0061* (2013.01)

(58) Field of Classification Search
CPC ........... H04L 25/4917; H03M 13/1111; H03M 13/611
USPC ........................................................ 375/295
See application file for complete search history.

(56) References Cited

U.S. PATENT DOCUMENTS

| | | | |
|---|---|---|---|
| 4,623,223 | A | 11/1986 | Kempf |
| 4,667,337 | A | 5/1987 | Fletcher |
| 4,739,323 | A | 4/1988 | Miesterfeld et al. |
| 4,742,349 | A | 5/1988 | Miesterfeld et al. |
| 5,377,020 | A | 12/1994 | Smitt |
| 5,487,665 | A | 1/1996 | Lechner et al. |
| 5,572,736 | A | 11/1996 | Curran |
| 5,833,340 | A | 11/1998 | Yoshikawa et al. |
| 5,856,980 | A | 1/1999 | Doyle |
| 5,890,005 | A | 3/1999 | Lindholm |
| 6,046,943 | A | 4/2000 | Walker |

(Continued)

FOREIGN PATENT DOCUMENTS

DE   102019108205 A1   10/2019
DE   102019118340 A1   1/2020

(Continued)

OTHER PUBLICATIONS

Khandelwal et al. DesignCon 2016 Year 2016.

(Continued)

*Primary Examiner* — Leila Malek
(74) *Attorney, Agent, or Firm* — Rowan TELS LLC

(57) ABSTRACT

Data bits are encoded in one or both of an eleven bit seven pulse amplitude modulated three-level (PAM-3) symbol (11b7s) format and a three bit two symbol (3b2s) format on a plurality of data channels, one or more auxiliary data channels, and an error correction channel. One or more of a cyclic redundancy check (CRC) value, a poison value, and a severity value are encoded as 11b7s and/or 3b2s PAM-3 symbols on an error correction channel.

16 Claims, 16 Drawing Sheets

(56) References Cited

U.S. PATENT DOCUMENTS

| | | |
|---|---|---|
| 6,285,300 B1 | 9/2001 | Colon-Bonet |
| 6,335,718 B1 | 1/2002 | Hong et al. |
| 6,348,915 B1 | 2/2002 | Yamashita et al. |
| 6,400,633 B1 | 6/2002 | Al-Shamma et al. |
| 6,442,077 B2 | 8/2002 | Shin |
| 6,489,900 B2 | 12/2002 | Shin et al. |
| 6,604,120 B1 | 8/2003 | De |
| 6,717,990 B1 | 4/2004 | Abousleman |
| 6,877,050 B2 | 4/2005 | Kanzaki et al. |
| 7,022,736 B2 | 4/2006 | Neuner et al. |
| 7,061,408 B2 | 6/2006 | Poechmueller |
| 7,082,489 B2 | 7/2006 | Yeh et al. |
| 7,135,996 B1 | 11/2006 | Lo et al. |
| 7,149,955 B1 | 12/2006 | Sutardja et al. |
| 7,188,263 B1 | 3/2007 | Rubinstein et al. |
| 7,356,632 B2 | 4/2008 | Yeh et al. |
| RE40,864 E | 7/2009 | Hong et al. |
| 7,620,116 B2 | 11/2009 | Bessios et al. |
| 7,782,682 B2 | 8/2010 | Matsuzaki et al. |
| 8,022,726 B2 | 9/2011 | Candage et al. |
| 8,022,736 B2 | 9/2011 | Chang et al. |
| 8,181,101 B2 | 5/2012 | Shen et al. |
| 8,189,263 B1 | 5/2012 | Wang et al. |
| 8,359,498 B1 | 1/2013 | Sutardja et al. |
| 8,984,380 B2 | 3/2015 | Vijayaraghavan et al. |
| 9,184,906 B1 | 11/2015 | Min et al. |
| 9,231,704 B1 | 1/2016 | Zhou et al. |
| 9,240,907 B2 | 1/2016 | Wang |
| 9,244,763 B1 | 1/2016 | Kankani et al. |
| 9,548,858 B1 | 1/2017 | Cirit et al. |
| 9,564,990 B1 | 2/2017 | Tiruvur et al. |
| 9,853,769 B1 | 12/2017 | Farjad et al. |
| 9,942,063 B2 | 4/2018 | Mendel |
| 9,978,171 B2 | 5/2018 | Bolz et al. |
| 10,312,896 B2 | 6/2019 | Kim et al. |
| 10,424,074 B1 | 9/2019 | Uralsky et al. |
| 10,491,435 B2 | 11/2019 | Lee et al. |
| 10,581,645 B1 | 3/2020 | Song et al. |
| 10,599,606 B2 | 3/2020 | Lee et al. |
| 10,657,094 B2 | 5/2020 | Lee et al. |
| 10,657,306 B1 | 5/2020 | Ma et al. |
| 10,699,427 B2 | 6/2020 | Uralsky et al. |
| 10,979,176 B1 | 4/2021 | Sudhakaran et al. |
| 2003/0035497 A1 | 2/2003 | Gorecki et al. |
| 2003/0076718 A1 | 4/2003 | Rolandi |
| 2003/0108134 A1 | 6/2003 | Stonick et al. |
| 2004/0114692 A1 | 6/2004 | Matsumoto |
| 2004/0153318 A1 | 8/2004 | Chamberlain |
| 2005/0086417 A1 | 4/2005 | Meyer et al. |
| 2005/0089126 A1 | 4/2005 | Zerbe et al. |
| 2005/0099325 A1 | 5/2005 | Bessios |
| 2005/0185281 A1 | 8/2005 | Perlin et al. |
| 2006/0109917 A1 | 5/2006 | Fonseka et al. |
| 2006/0139186 A1 | 6/2006 | Hoyer |
| 2006/0280272 A1 | 12/2006 | Stojanovic |
| 2007/0203962 A1 | 8/2007 | Hirairi |
| 2008/0181331 A1 | 7/2008 | Casper et al. |
| 2008/0262855 A1 | 10/2008 | Mehrotra et al. |
| 2009/0193319 A1 | 7/2009 | Shen et al. |
| 2009/0323722 A1 | 12/2009 | Sharma |
| 2010/0174844 A1 | 7/2010 | Chu |
| 2010/0214138 A1 | 8/2010 | Hollis |
| 2010/0299440 A1 | 11/2010 | Meyer et al. |
| 2011/0264719 A1 | 10/2011 | Mortensen |
| 2012/0110255 A1 | 5/2012 | Meyer et al. |
| 2012/0144161 A1 | 6/2012 | Elliott |
| 2012/0204082 A1 | 8/2012 | Shen et al. |
| 2012/0206280 A1 | 8/2012 | Abbasfar et al. |
| 2012/0250746 A1 | 10/2012 | Sonntag |
| 2013/0226982 A1 | 8/2013 | Yu |
| 2014/0153620 A1 | 6/2014 | Longo et al. |
| 2014/0173296 A1 | 6/2014 | Muff et al. |
| 2014/0281075 A1 | 9/2014 | Hollis |
| 2014/0298458 A1 | 10/2014 | Lewis et al. |
| 2014/0358979 A1 | 12/2014 | Singh |
| 2015/0137789 A1 | 5/2015 | Furtner |
| 2015/0235634 A1 | 8/2015 | Liu et al. |
| 2016/0013958 A1 | 1/2016 | Mishra et al. |
| 2016/0164705 A1 | 6/2016 | Whitby-Strevens |
| 2016/0173134 A1 | 6/2016 | Kwon et al. |
| 2016/0373557 A1 | 12/2016 | Sikkink et al. |
| 2017/0075854 A1 | 3/2017 | Hollis |
| 2017/0207908 A1 | 7/2017 | Cirit et al. |
| 2017/0220518 A1 | 8/2017 | Sengoku et al. |
| 2017/0272285 A1 | 9/2017 | Shokrollahi et al. |
| 2017/0310529 A1 | 10/2017 | Yang et al. |
| 2017/0373887 A1 | 12/2017 | Ho |
| 2018/0091189 A1 | 3/2018 | Chada et al. |
| 2018/0091335 A1 | 3/2018 | Schnizler |
| 2018/0123839 A1 | 5/2018 | Chung et al. |
| 2019/0199560 A1 | 6/2019 | Bossard et al. |
| 2019/0303340 A1 | 10/2019 | Lee et al. |
| 2019/0305765 A1 | 10/2019 | Lee et al. |
| 2019/0305995 A1 | 10/2019 | Lee et al. |
| 2020/0050923 A1 | 2/2020 | Patney et al. |
| 2020/0151289 A1 | 5/2020 | Sikka et al. |
| 2020/0159437 A1* | 5/2020 | Walker .................. G06F 3/0647 |
| 2020/0175392 A1 | 6/2020 | Tang et al. |
| 2020/0210276 A1 | 7/2020 | Sullivan et al. |
| 2020/0210805 A1 | 7/2020 | Drozdowski et al. |
| 2021/0012825 A1* | 1/2021 | Martinelli ............ G11C 29/802 |
| 2021/0105023 A1* | 4/2021 | Cornelius ............... H03M 7/46 |

FOREIGN PATENT DOCUMENTS

| | | |
|---|---|---|
| DE | 102019123711 A1 | 3/2020 |
| EP | 3167579 B1 | 6/2018 |
| KR | 20010065770 A | 7/2001 |
| KR | 100321164 B1 | 3/2002 |
| WO | 2015077606 A1 | 5/2015 |

OTHER PUBLICATIONS

Kim, Kyeounsoo, et al., An Efficient Frame Memory Intci-face of MPEG-2 Vidco Encoder ASIC Chip, IEEE Transaclions on Consumer Electronics, vol. 45, No. 3, Aug. 1999, pp. 507-514.

Kim, Sunghwan, et al., Low-power data representation, Electronics Letters May 25, 2000 vol. 36, No. 11, pp. 958-959.

Leung, Patrick S.-K., et al., Block-Inversion-Coded QAM Systems, IEEE Transactions on Communications, vol. 36, No. 7, Jul. 1988, pp. 797-805.

Lidgate, D., Electrical interlock design for complex high-power switching networks, Proc. IEE, vol. 126, No. 2, Feb. 1979, pp. 152-158.

Lin, Rung-Bin, et al., Theoretical Analysis of Bus-Invert Coding, Proc. 43rd IEFE Midwest Symp. on Circuits and Systems, Lansing MI, Aug. 8-11, 2000, pp. 742-745.

Low Power Bus Transform Coding for Multi Level Signals 2006 ZAMAN.

Macchiarulo, Luca, Low-Energy Encoding for Deep-Submicron Address Buses, ISLPED'01, Aug. 6-7, 2001, Huntington Beach, California, USA, pp. 176-181.

Mehta, Huzefa, et al., Some Issues in Gray Code Addressing, Proceedings of the Sixth Great Lakes Symposium on VLSI, Mar. 1996, Ames, IA, USA, pp. 178-181.

Moshnyaga, Vasily G., et al., Energy Saving Techniques for Architecture Design of Portable Embedded Devices, Proceedings. Tenth Annual IEEE International ASIC Conference and Exhibit (Cat. No. 97TH8334), Sep. 1997, Portland, OR, USA, pp. 163-167.

Mudge, Trevor, Power: A First-Class Architectural Design Constraint, Computer, Apr. 2001, pp. 52-58.

Murgai, Rajeev, et al., Using Complement at ion And Resequencing To Minimize Transitions, Proceedings 1998 Design and Automation Conference. 35th DAC. (Cat. No. 98CH36175), Jun. 1998, San Francisco, CA, USA, pp. 694-697.

Musoll, Enric, et al., Exploiting the locality of memory references to reduce the address bus energy, Proceedings of 1997 International Symposium on Low Power Electronics and Design, Aug. 1997, Monteray, CA, USA, pp. 202-207.

(56) References Cited

OTHER PUBLICATIONS

Nakamura, Kazuyuki, et al., A 50 % Noise Reduction Interface Using Low-Weight Coding, 1996 Symposium on VLSI Circuits Digest of Technical Papers, Jun. 1996, Honolulu, HI, USA, pp. 144-145.
Noll, Tobias G., Low-Power Strategies for High-Performance CMOS Circuits, ESSCIRC '94: Twientieth European Solid-State Circuits Conference, Sep. 1994, Ulm, Germany, pp. 72-83.
NPL_33681DE_Office Action Jul. 26, 2021.
NPL_Khandelwal_etal_DesignCon 2016 pp. 1-26.
Orton, James L. et al., An Improved Channel Coding Algorithm for Low-Frequency Spectral Suppression, IEEE Transactions on Communications, vol. 37, No. 10, Oct. 1989, pp. 1088-1091.
P. S. Teja, "Design of Radix-8 Booth Multiplier Using Koggestone Adder for High Speed Arithmetic Applications," Emerging Trends in Electrical, Electronics & Instrumentation Engineering: An international Journal (EEIEJ), vol. 1, No. 1, Feb. 2014 (Year: 2014).
Panda, Preeti R., Reducing Address Bus Transit ions for Low Power Memory Mapping, Proceedings ED&TC European Design and Test Conference, Mar. 1996, Paris, France, pp. 63-67.
Panda, Preeti Ranjan, et al., Low-Power Memory Mapping Through Reducing Address Bus Activity, IEEE Transactions on Very Large Scale Integration (VLSI) Systems, vol. 7, No. 3, Sep. 1999, pp. 309-320.
Park, Arvin, et al., Codes to Reduce Switching Transients Across VLSI I/O Pins, ACM SIGARCH Computer Architecture News, Sep. 1992, pp. 17-21.
Patra, P., et al., Power-efficient Delay-insensit ive Codes for Data Transmission, Proceedings of the 28th Annual Hawaii Intemational Conference on System Sciences—1995, pp. 316-323.
Pedram, Massoud, Power Optimization and Management in Embedded Systems, Proceedings of the ASP-DAC 2001. Asia and South Pacific Design Automation Conference 2001 (Cat. No. 01EX455), Feb. 2001, Yokohama, Japan, pp. 239-244.
Pupalaikis et al., Designcon 2017, Inphi, 2017, (Year: 2017).
Raghunathan, Anand, et al., Controller re-specification to minimize switching activity in controller/data path circuits, ISLPED 1996 Monterey CA USA, 1996, pp. 301-304.
Ramprasad, Sumant, et al., Achievable Bounds On Signal Transition Activity, 1997 Proceedings of IEEE International Conference on Computer Aided Design (ICCAD), Nov. 1997, San Jose, CA, USA, pp. 126-129.
Ramprasad, Sumant, et al., Coding For Low-Power Address And Data Busses: A Source-Coding Framework and Applications, Proceedings Eleventh International Conference on VLSI Design, Jan. 1998, Chennai, India, pp. 18-23.
Roy, Kaushik, et al., Design of Low Power Digital Systems, Emerging Technologies: Designing Low Power Digital Systems, May 1996, pp. 137-204.
S. Samavi, "High Radix Multipliers," Jan. 2014, retrieved from https://www.researchgate.net/publication/262836009 (Year: 2014).
Sacha, John R., et al., Number Representations for Reducing Data Bus Power Dissipation, Conference Record of Thirty-Second Asilomar Conference on Signals, Systems and Computers (Cat. No. 98CH36284), Nov. 1998, Pacific Grove, CA, USA, pp. 213-217.
Sasaki, Katsuro, et al., A 23-ns 4-Mb CMOS SRAM with 0.2-uA Standby Current, IEEE Journal.O F Solid-~Tatec Ircuits, vol. 25, No. 5, Oct. 1990, pp. 1075-1081.
Sechler, R.F., et al., Design at the system level with VLSI CMOS, IBM J. Res. Develop. vol. 39 . No. 1/2 Jan./Mar. 1995, pp. 5-22.
Shin, Youngsoo, et al., Narrow Bus Encoding for Low Power Systems, Proceedings 2000. Design Automation Conference. (IEEE Cat. No. 00CH37106), Jan. 2000, Yokohama, Japan, pp. 217-220.
Shin, Youngsoo, et al., Partial Bus-Invert Coding for Power Optimization of Application-Specific Systems, IEEE Transactions on Very Large Scale Integration (VLSI) Systems, vol. 9, No. 2, Apr. 2001, pp. 377-383.
Shin, Youngsoo, et al., Partial Bus-Invert Coding for Power Optimization of System Level Bus, Proceedings. 1998 International Symposium on Low Power Electronics and Design (IEEE Cat. No. 98TH8379), Aug. 1998, Monterey CA, USA, pp. 127-129.
Shin, Youngsoo, et al., Reduction of bus transitions with partial bus-invert coding, Electronics Letters Apr. 2, 1998 Vol. 34, No. 7, pp. 642-643.
Siegmund, Robert, et al., Adaptive Partial Businvert Encoding for Power Efficient Data Transfer over Wide System Buses, Proceedings 13th Symposium on Integrated Circuits and Systems Design (Cat. No. PR00843), Sep. 2000, Manaus, Brazil, pp. 371-376.
Sotiriadis, Paul P., et al., Bus Energy Minimization by Transition Pattern Coding (TPC) in Deep Sub-Micron Technologies, IEEE/ACM International Conference on Computer Aided Design. ICCAD-2000. IEEE/ACM Digest of Technical Papers (Cat. No. 00CH37140), Nov. 2000, San Jose, CA, USA, pp. 322-327.
Sotiriadis, Paul P., et al., Transition Pattern Coding: An approach to reduce Energy in Interconnect, Proceedings of the 26th European Solid-State Circuits Conference, Sep. 2000, Stockholm, Sweden.
Space Coding Applied to High Speed Chip FARZAN 2004.
Stan, Mircea R., et al., Bus-Invert Coding for Low-Power I/O, IEEE Transactions on Very Large Scale Integration (VLSI) Systems, vol. 3, No. I , Mar. 1995, pp. 49-58.
Stan, Mircea R., et al., Two-Dimensional Codes for Low Power, ISLPED 1996 Monterey CA USA, pp. 335-340.
Stan, Mircea R., Low-Power Encodings for Global Communication in CMOS VLSI, IEEE Transactions on Very Large Scale Integration (VLSI) Systems, vol. 5, No. 4, Dec. 1997, pp. 444-455.
Su, Ching-Long, et al., Cache Designs for Energy Efficiency, Proceedings of the 28th Annual Hawaii International Conference on System Sciences—1995, pp. 306-315.
Su, Ching-Long, et al., Saving Power in the Control Path of Embedded Processors, IEEE Design & Test of Computers-Embedded Processors, Winter 1994, pp. 24-30.
Sundararajan, Vijay, et al., Data Transmission Over a bus with Peak-Limited Transition Activity, Proceedings 2000. Design Automation Conference. (IEEE Cat. No. 00CH37106), Jan. 2000, Yokohama, Japan, pp. 221-224.
Tabor, Jeff F., Noise Reduction Using Low Weight and Constant Weight Coding Techniques, MIT Artificial Intelligence Laboratory Technical Report 1232, May 11, 1990.
Torku, Kofi E., et al., Noise Problems in Testing VLSI Hardware, IEEE Design & Test of Computers, Dec. 1985, pp. 36-43.
www.edaboard.com, how to make an 8-3 encoder using 4-2 encoders, Jul. 2010, pp. 1-4 (Year: 2010).
U.S. Appl. No. 16/557,637, filed Aug. 30, 2019, Sunil Sudhakaran, Entire Document.
10 2019 107 849.0_DPMA_Office Action Dated Aug. 11, 2021.
10 2019 108 205.6 DPMA Office Action Dated Aug. 10, 2021.
1133612019.8_First Office Action of CNIPA dated Jun. 8, 2023.
201910242543.7_First Office Action dated Jun. 5, 2023.
Acquaviva, Andrea, et al., A Spatially-Adaptive BusInterface for Low-Switching Communication, ISLPED '00, pp. 238-240, Rapallo, Italy., Feb. 2020.
AN 835 PAM4 Signaling Fundamentals by Intel Mar. 12, 2019.
Arnold, J.S., et al., Design of tightly-coupled multiprocessing programming, IBM Systems Journal, vol. 13 , Issue: 1, pp. 60-87, 1974.
Baek, Kwang-Hyun, et al., A Low Energy Encoding Technique for Reduction of Coupling Effects in SoC Interconnects, Proc. 43rd IEEE Midwest Symp. on Circuits and Systems, pp. 80-83, Lansing MI. Aug. 11, 2000.
Benini, Luca, et al., Address Bus Encoding Techniques for System-Level Power Optimization, Proceedings Design, Automation and Test in Europe, IEEE, Paris, France, Feb. 1998.
Benini, Luca, et al., Asymptotic Zero-Transition Activity Encoding for Address Busses in Low-Power Microprocessor-Based Systems, Proceedings Great Lakes Symposium on VLSI, IEEE, Urbana-Champaign, IL, USA, pp. 77-82, Mar. 1997.
Benini, Luca, et al., Power Optimization of Core-Based Systems by Address Bus Encoding, IEEE Transactions on Very Large Scale Integration (VLSI) Systems, vol. 6, No. 4, Dec. 1998, pp. 554-562.
Benini, Luca, et al., System-Level Power Optimization: Techniques and Tools, ISLPED99, San Diego, CA, USA, 1999, pp. 288-293.

(56) References Cited

OTHER PUBLICATIONS

Bishop, Benjamin, et al., A Low-Energy Adaptive Bus Coding Scheme, Proceedings IEEE Computer Society Workshop on VLSI 2001. Emerging Technologies for VLSI Systems, Orlando, FL, USA, Apr. 2001, pp. 118-122.
Campbell, John E., et al., Design Considerations for a VLSI Microprocessor, IBM J. Res. Develop. vol. 26 No. 4,. Jul. 1982, pp. 454-463.
Canegallo, Roberto, et al., Low Power Techniques for FLASH Memories, ISCAS 2001. The 2001 IEEE International Symposium on Circuits and Systems (Cat. No. 01CH37196), May 2001, Sydney, NSW, Australia, IV-494-IV497.
Catthoor, F., et al., Global Communication and Memory Optimizing Transformations for Low Power Signal Processing Systems, Proceedings of 1994 IEEE Workshop on VLSI Signal Processing, La Jolla, CA, USA, Oct. 1994, pp. 178-187.
Chandrakasan, Anantha P., et al., A Low-Power Chipset for a Portable Multimedia I/O Terminal, IEEE Journal of Solid-State Circuits. vol. 29, No. 12, Dec. 1994, pp. 1415-1428.
Chandrakasan, Anantha P., et al., Low-Power CMOS Digital Design, IEEE Journal of Solid-State Circuits. vol 27, No. 4. Apr. 1992, pp. 473-484.
Chandrakasan, Anantha P., et al., Minimizing Power Consumption in Digital CMOS Circuits, Proceedings of the IEEE, vol. 83, No. 4, Apr. 1995, pp. 498-523.
Chandrakasan, Anantha P., et al., Optimizing Power Using Transformations, IEEE Transactions on Computer-Aided Design of Integrated Circuits and Systems, vol. 14, No. 1, Jan. 1995, pp. 12-31.
Chang, Naehyuck, et al., Bus Encoding for Low-Power High-Performance Memory Systems, DAC '00: Proceedings of the 37th Annual Design Automation Conference, Jun. 2000, pp. 800-805.
Chang, Naehyuck, et al., Dual-Mode Low-Power Bus Encoding for High-Performance Bus Drivers,Conference: TENCON 99. Proceedings of the IEEE Region 10 Conference, vol. 2, Jan. 2000, pp. 876-879.
Chang, You-Sung, et al., Conforming Inverted Data Store for Low Power Memory, Proceedings. 1999 International Symposium on Low Power Electronics and Design (Cat. No. 99TH8477), Aug. 1999, San Diego, CA, USA.
Chao, H.H., et al., Designing the Micro370, IEEE Design & Test, Jun. 1987, pp. 32-40.
Chatterjee, Pallab, ULSI CMOS—The Next Ten years, Microelectronic Engineering 19 (1992), pp. 3-8.
Cheng, Wei-Chung, et al., Memory Bus Encoding for Low Power: A Tutorial, Proceedings of the IEEE 2001. 2nd International Symposium on Quality Electronic Design, Mar. 2001, San Jose, CA, USA, pp. 199-204.
Cheng, Wei-Chung, et al., Power-Optimal Encoding for DRAM Address Bus, ISLPED '00: Proceedings of the 2000 international symposium on Low power electronics and design, Aug. 2000, pp. 250-252.
Chou, Tan-Li, et al., Estimation of Circuit Activity Considering Signal Correlations and Simultaneous Switching, IEEE/ACM International Conference on Computer-Aided Design, Nov. 1994, pp. 300-303.
De Angel, Edwin, et al., Survey of Low Power Techniques for VLSI Design, Innovative Systems in Silicon Conference Session 6: Analog and Low Power Electronics, 1996, pp. 159-169.
Donaldson, Darrel D., et al., SNOS 1K x 8 Static Nonvolatile RAM, IEEE Journal of Solid-State Circuits, vol. SC-17, No., 5, Oct. 1982, pp. 847-851.
Elliott, R.C., Managed Load Distribution, Intelec '81—Third International Telecommunications Energy Conference, pp. 50-55.
Elpida, 128M bits Self Terminated Interface DDR SDRAM, Preliminary Datasheet Ver. 1.0, Jul. 2002.

Ewen, J. F., et al., CMOS circuits for Gb/s serial data communication, IBM J. Res. Develop. vol. 39 No. 1/2 Jan./Mar. 1995, pp. 73-81.
Fagan, John L., et al., A 16-kbit Nonvolatile Charge Addressed Memory, IEEE Journal of Solid-State Circuits, vol. SC-11, No. 5, Oct. 1976, pp. 631-636.
Fornaciari, William, et al., Influence of Caching and Encoding on Power Dissipation of System-Level Buses for Embedded Systems, Design, Automation and Test in Europe Conference and Exhibition, 1999. Proceedings (Cat. No. PR00078), Mar. 1999, Munich, Germany.
GDDR4 Read and Write DBI, GDDR4 SGRAM Data Inversion.
Givargis, Tony D., et al., Interface and Cache Power Exploration for Core-Based Embedded System Design, 1999 IEEE/ACM International Conference on Computer-Aided Design. Digest of Technical Papers (Cat. No. 99CH37051), Nov. 1999, pp. 270-273.
Green, J.H., et al., Line-Protection Switching, The Bell System Technical Journal, vol. 53, No. 10, Dec. 1974, USA, pp. 2011-2034.
Hakenes, Rolf, et al., A Segmented Gray Code for Low-Power Microcontroller Address Buses, Proceedings 25th EUROMICRO Conference. Informatics: Theory and Practice for the New Millennium, Sep. 1999, Milan, Italy.
Harboe-Sørensen, R., et al., Radiation Pre-screening of 4 Mbit Dynamic Random Access Memories for Space Application, RADECS 91 First European Conference on Radiation and its Effects on Devices and Systems, Sep. 1991, La Grande-Motte, France, pp. 489-504.
Harris, Erik P., et al., Technology Directions for Portable Computers, Proceedings of the IEEE, vol. 83, No. 4, Apr. 1995, pp. 636-658.
Hirsch, Donald J., Computer Communications Interface Devices for Tactical C3, MILCOM 1986—IEEE Military Communications Conference: Communications-Computers: Teamed for the 90's, Oct. 1986, pp. 5.4.1-5.4.5.
Hong, Sungpack, et al., Bus-Invert Coding for Low-Power IO—A Decomposition Approach, hoc. 43rd IEEE Midwest Symp. on Circuits and Systems, Lansing MI, Aug. 8-11, 2000, pp. 750-753.
Hossain et al, Channel-Adaptive ADC and TDC for 28 Gb/s PAM-4 Digital Receiver.
Hossain, Rozak, et al., Low Power via Reduced Switching Activity and its Application to PLAs, pp. 100-103.
Hoyme, Kenneth, et al., SAFEbus, Proceedings IEEE/AIAA 11th Digital Avionics Systems Conference, Oct. 1992, Seattle, WA, USA, pp. 68-73.
Hsieh, Cheng-Ta, et al., Architectural Power Optimization by Bus Splitting, Proceedings Design, Automation and Test in Europe Conference and Exhibition 2000 (Cat. No. PR00537), Mar. 2000, Paris, France.
Iizuka, Tetsuya, Substrate-fed CMOS Memory Device, 1978 International Electron Devices Meeting, Dec. 1978, Washington, DC, USA, pp. 222-226.
Im et al, A 40-to-56 Gb/s PAM-4 Receiver With Ten-Tap Direct Decision-Feedback Equalization in 16-nm FinFET.
Irwin, Mary Jane, et al., Energy Issues in Multimedia Systems, 1999 IEEE Workshop on Signal Processing Systems. SiPS 99. Design and Implementation (Cat. No. 99TH8461), Oct. 1999, Taipei, Taiwan, pp. 24-33.
www.electronics-tutorials.ws, binary decoder, Feb. 2014, pp. 1-5 (Year: 2014).
Yang, Jun, et al., FV Encoding for Low-Power Data I/O, ISLPED'01, Aug. 6-7, 2001, Huntington Beach, California, USA, pp. 84-87.
Yang, Jun, et al., FV Encoding for Low-Power Data I/O, ISLPED'01: Proceedings of the 2001 International Symposium on Low Power Electronics and Design (IEEE Cat. No. 01TH8581), Aug. 2001, Huntington Beach, CA, USA, pp. 84-87.
Zhang et al, PAM4 Signalling for 56G Serial Link Applications—A Tutorial (Year: 2016).

\* cited by examiner

HARDWARE-EFFICIENT PAM-3 ENCODER AND DECODER

CROSS REFERENCE TO RELATED APPLICATIONS

This application claims priority and benefit under 35 U.S.C. 119 to US Application No. 63/328,172, titled "Hardware Efficient PAM3 11 bit-7Symbol Encoder/Decoder Design", filed on Apr. 6, 2022, the contents of which are incorporated herein by reference in their entirety.

BACKGROUND

When it comes to signaling schemes, dynamic random access memory (DRAM) technologies are mostly limited to single ended PAM-2 (Pulse Amplitude Modulation 2-level) signaling. The Graphics Double Data Rate Version 6 (GDDR6x) memory technology introduced PAM-4 (Pulse Amplitude Modulation 4-level) signaling on the DRAM interface and provided a means to boost the DRAM bandwidth despite a DRAM transistor/process limitation, by taking advantage of the voltage margin to encode two bits within a single symbol. PAM-4 also has the potential to increase the horizontal eye margin by operating at a lower baud rate, thereby potentially increasing the operable frequency maximum for the interface.

NRZ (Non-Return-to-Zero) or PAM-2 signaling may operate at a DDR (Double Data Rate) clock of (for example) 12 GHz to support an interface rate of (for example) 24 Gbps (Unit Interval (UI)-41.7ps). PAM-4 may operate at a DDR clock of (for example) 6 GHz to support an interface rate of (for example) 24 Gbps (UI=83.4ps, for example), thus achieving higher performance. However, PAM-4 signaling may experience significant eye-closure due to eye-height limitations, and is potentially more susceptible to noise and crosstalk due to a lower signal-to-noise ratio. Low voltage PAM-4 operation makes this issue even more acute.

Schemes used in GDDR6x, such as Maximum Transition Avoidance, alleviate the problem to some extent, but as signaling speeds increase, the overall interface margin reduces, thereby impacting the ability to scale DRAM bandwidth, while increasing complexity and costs.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 7A and FIG. 7B depict logic 700 for a PAM-3 encoder in one embodiment.

DETAILED DESCRIPTION

Figure 1:
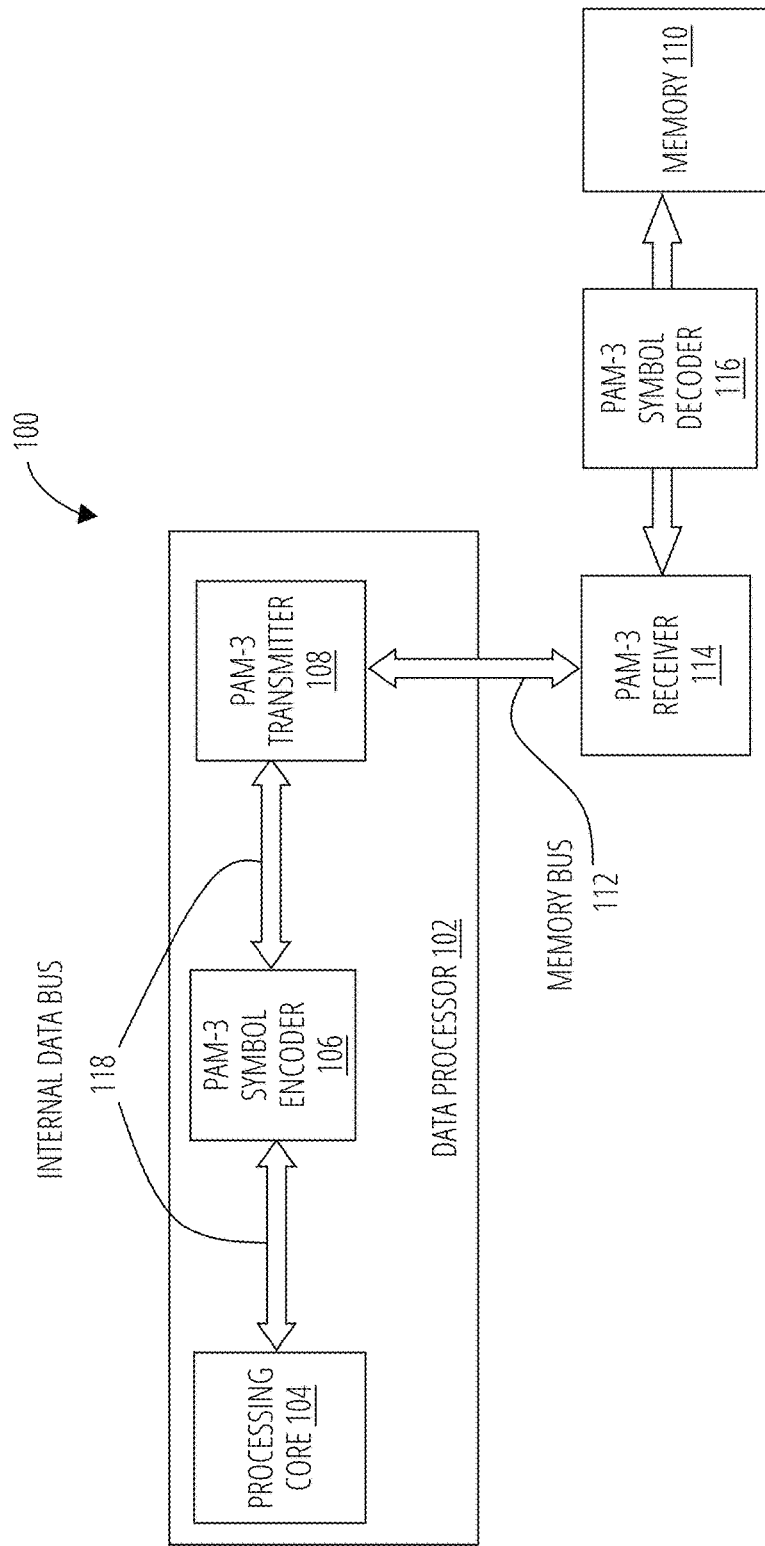
FIG. 1 depicts a data communication system 100 in accordance with one embodiment.

The following description refers to particular pins of a memory bus. Types of memory that may utilize these pins include GDDR SDRAM (Graphics Double Data Rate Synchronous Dynamic Random-Access Memory) synchronous graphics random-access memory (SGRAM) used in graphics cards, game consoles, and high-performance computing.

Each pin provides a communication channel named for the pin. Therefor in the following description, pin names may also be understood to refer to channels of the same name, and vice-versa. Also, the term "pin" should be understood to generally mean an ingress or egress point of signals to and from a circuit (that may be internal to a package), not necessarily an external pin on a circuit package. Table I below provides names for particular pins/channels discussed below and a description of their purpose in operation.

TABLE I

| | |
|---|---|
| DQ[N:0] | Data Input/Output Pins (data channels) for N parallel Bits |
| DQX | Data Input/Output Extension Pin. The DQX pin/channel may be optionally activated and utilized in high-speed transmission modes, e.g., burst modes. |
| DQY | Another Data Input/Output Extension Pin. The DQY pin/channel may be optionally activated and utilized in high-speed transmission modes, e.g., burst modes. |
| EDC | Error Detection Code Pin. Inter-alia, calculated CRCs for the data transmitted on the DQ and DQX pins are transmitted on the EDC pin/channel. This pin may also be referred to as DQE. |

In a high speed mode of operation, a memory (e.g., a GDDR SGRAM) may utilize an embodiment of three-level pulse amplitude modulation (PAM-3) encodings described herein on one or more of the pins in Table I.

Certain terms are used herein and should be understood as follows. Other terms used herein should be accorded their ordinary meaning in the art or understood in the context they are provided.

"Auxiliary data channel" refers to a channel, which may be one or more conductors, that is engaged only in certain communication modes, typically modes of higher-speed communication that a base-level mode. An auxiliary data channel is distinguished from other types of data channels by the fact that it is optional to data communications and not utilized in all modes of operation. Another term for auxiliary data channel is "optional data channel". The DQX and DQY pins are examples of auxiliary data channels.

"Error correction channel" refers to a bus channel, which may comprise a single or multiple signal conductors, that is used to communicate error correction and/or error detection values for communicated data values. In one specific embodiment, the error correction channel is a single conductor (serial bit line) and is the exclusive conductor on the bus for communicating error correction values for data values communicated at least in part over other conductors of the bus. The EDC pin is an example of an error correction channel.

"Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

In this description and the claims, 'data bits' should be understood to mean any data, and cyclic redundancy check (CRC) values, poison values, and severity values should be understood to constitute 'meta-data' that is used to interpret or test the data bits. Thus 'data bits' should not be understood to refer to CRC values, poison values, or severity values unless otherwise indicated by context.

PAM-3 signaling may be utilized to increase interface bandwidth while potentially reducing IO (Input/Output) training (configuration) complexity and cost. At comparable frequencies, a PAM-3 interface as disclosed herein may benefit from an increased horizontal and vertical eye margin relative to PAM-4/GDDR6x, and may ameliorate DRAM process and transistor limitations at higher speeds.

PAM-3, given its ternary nature, has less data encoding capacity per symbol than PAM-4 and thus requires more pins on the interface to transmit the same information at the same frequency. Techniques such as Cycle-Redundancy Check (CRC) bits may be utilized to provide random and burst error detection. For example, an 18-bit CRC per 256 bits of data may utilized. For write operations, one (1) poison data bit per 256 bit access enables the host device to mark/preserve on-chip data errors in the DRAM. This poison information is stored in the DRAM on writes that are known by the host to have erroneous data. On reads, the poison flag for the address in question is transferred back to the host as a means of error preservation or containment. In addition, a severity bit may be utilized with read operations to indicate to the host that the corresponding data on the DRAM has suffered an uncorrectable error.

Combined, this means that the total payload for 256 bits of data includes 18 bits of CRC, one poison bit, and one severity bit. The techniques herein enable implementations to encode and map this information on to a PAM-3 transmitter and receiver, e.g., between a processor and a DRAM, with throughput comparable to PAM-4 at comparable interface frequencies.

In one embodiment, a 12-pin interface is utilized to communicate two (2) PAM-3 symbols with every three (3) bits, i.e. two PAM-3 symbols encode three binary bits. This encoding may be abbreviated as '3b2s'. The 3b2s encoding may be utilized for every symbol communicated for bursts comprising 256 bits of data, 18 bits of CRC code, one poison bit, and one severity bit. The hardware for such an encoder/decoder is relatively non-complex. However, this embodiment utilizes 12 pins, a drawback.

Other embodiments may utilize more efficient encodings that minimize the following expression: $(2^b\text{-}3^T)$, where b is the number of bits and T is the number of symbols. These encodings may achieve a greater data density at the expense of more complex hardware for the encoder and/or decoder. One such encoding may be expressed as 11b7s, meaning that 11 bits are utilized to communicate every 7 symbols. Three example techniques that utilize these encodings are provided below.

A first embodiment utilizes twenty-three (23) 11b7s-type encodings to map 253 data bits to 161 PAM-3 symbols, three (3) data bits plus eight (8) CRC bits to another seven (7) PAM-3 symbols, ten (10) CRC bits plus one (1) poison bit to another seven (7) PAM-3 symbols, and maps one (1) severity bit to another one (1) PAM-3 symbol. This amounts to utilization of 161+7+7+1=176 symbols. In these embodiments, on interfaces with eleven (11) IO pins, the 176 total symbols may all be communicated in a sixteen (16) symbol, 32 bit (per IO pin) burst. A potential drawback of such embodiments is error multiplication due to the encoding of the CRC bits, which may in turn impact CRC efficacy for random errors.

A second embodiment also utilizes twenty-three (23) 11b7s-type encoding that map 253 data bits to 161 PAM-3 symbols. However this embodiment utilizes one (1) 3b2s-type encoding to map three (3) data bits to two (2) PAM-3 symbols, and six (6) additional 3b2s-type encodings to map eighteen (18) CRC bits to twelve (12) PAM-3 symbols. The poison bit and the severity bit are made mutually exclusive and encoded as one PAM-3 symbol; a zero (0) value of the symbol may indicate (no poison, no severity), a value of one (1) may indicate (poison, no severity), and a value of two (2) may indicate (severity, no poison). This amounts to utilization of 161+2+12+1=176 symbols. In these embodiments, on interfaces with eleven (11) IO pins, the 176 total symbols may all be communicated in a sixteen (16) symbol (per IO pin) burst. Because the CRC bits are encoded using 3b2s-type encoding, these embodiments may not incur the error amplification problem of the first embodiment. However, due to the mutually exclusive assumption of poison and severity, a host device utilizing these embodiments cannot get information of uncorrectable errors on memory locations that are carrying poisoned data. Depending on the resiliency requirements of the system, this constraint may be acceptable.

A third embodiment utilizes the encodings of the second embodiment, except that the poison and severity bits are encoded as data using specific codewords reserved for these bits. When either a poison or severity event occurs, data integrity is a "don't care" (due to the inherent nature of poison/severity). A previously "unused" encoding for data bits from one of the 11b7s mapping blocks may be utilized to represent poison. Two other unused encodings may represent severity, or severity and poison simultaneously. This approach utilizes 175 total PAM-3 symbols, one fewer than the other two embodiments, with the ability to independently indicate poison and severity, no CRC error multiplication, and one spare symbol that may be used to communicate additional meta-data about the burst.

A particular implementation may utilize one or a combination of these embodiments for both the read and write directions, or differently for read and for write, depending on the desired level of complexity, power consumption and area on the encoder and decoder logic.

Generally, transmitters are described comprising logic to encode eleven bits as seven pulse amplitude modulated three-level (PAM-3) symbols (11b7s encoded symbols) on eight data channels and two auxiliary data channels, and logic to encode a cyclic redundancy check (CRC) value, a poison value, and a severity value as PAM-3 symbols utilizing either 11b7s or 3b2s encoding. Specific embodiments are described that encode the cyclic redundancy check (CRC) value, poison value, and/or severity value on the error correction channel; however in general, these values may be encoded on the error correction channel and/or auxiliary data channels. In one embodiment the cyclic redundancy check value, the poison value, and the severity value are 11b7s encoded; in other embodiments some or all of these values are 3b2s encoded. In one embodiment the poison value and the severity value are encoded using 11b7s encoding and communicated on one of the data channels.

In some embodiments, three bits of data are encoded as 3b2s symbols, for example on the error correction channel. The poison value and the severity value are encoded as one 3b2s symbol in some embodiments.

Other technical features and embodiments may be readily apparent to one skilled in the art from the following figures, descriptions, and claims.

Referring to FIG. 1, a data communication system 100 comprises a transmitting device such as a data processor 102 that includes a processing core 104, PAM-3 symbol encoder 106, and a PAM-3 transmitter 108. The data processor 102 may in some embodiments comprises a graphics processing unit (GPU), a central processing unit (CPU), a system on a chip (SoC), or other well-known data processing devices.

The data processor 102 communicates with a receiving device such as a memory 110 over a bus such as a memory bus 112. A PAM-3 receiver 114 and PAM-3 symbol decoder 116 receive and process PAM-3 signals communicated from the data processor 102 to the memory 110 over the memory bus 112.

The data processor 102 utilizes an internal data bus 118 to transmit data bursts to and from the processing core 104 over a multi-lane internal data bus 118. The PAM-3 symbol encoder 106 receives a burst of data to encode from the processing core 104 and performs PAM-3 encoding on that burst. The PAM-3 transmitter 108 transmits the encoded burst to the PAM-3 receiver 114 via the memory bus 112. The PAM-3 receiver 114 receives the encoded burst and sends the encoded burst to the PAM-3 symbol decoder 116 to decode the burst. Once decoded, the burst is sent to the memory 110.

This is a simplified diagram. In practice, there would typically be encoders and decoders on both ends of the memory bus 112 for both writing to and reading from the memory 110.

Figure 2:
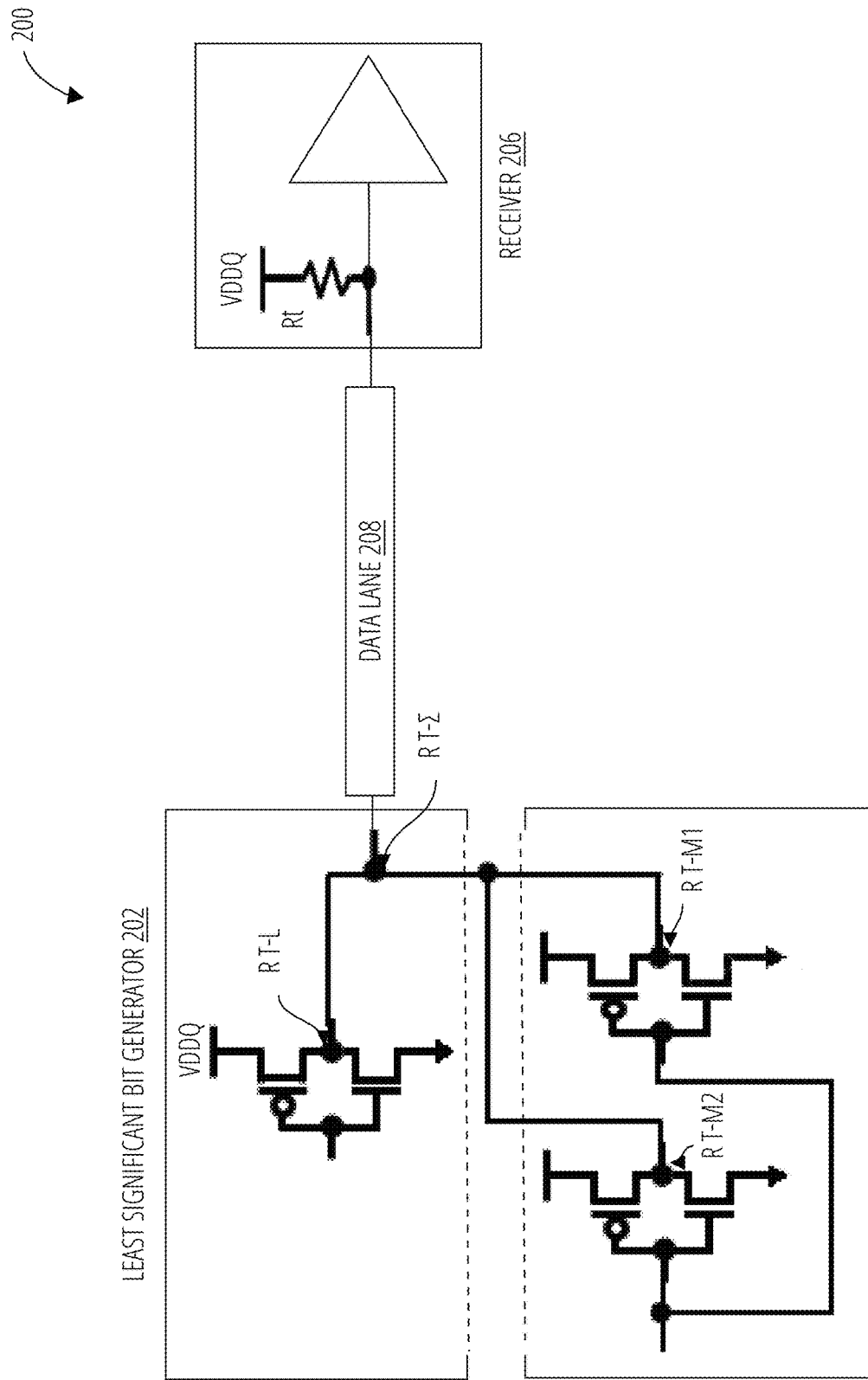
FIG. 2 depicts an embodiment of a PAM-3 transceiver 200.

FIG. 2 depicts a PAM-3 transceiver 200 for a single data lane of a serial data bus in one embodiment. The exemplary PAM-3 transceiver 200 (embodiments with fewer transistors may also be implemented) comprises a least significant bit transmitter 202, a most significant bit transmitter 204, a receiver 206, and a data lane 208. The PAM-3 transceiver 200 utilizes the least significant bit transmitter 202 and the most significant bit transmitter 204 to generate a three-level symbol (a similar arrangement may also be utilized to generate a four-level symbol for PAM-4 communication) on the data lane 208. One PAM-3 symbol represents one of three binary values; two PAM-3 symbols represent one of nine possible binary values, and so on. Herein the term "symbol" refers to a voltage level generated by a line driver on a serial data bus data lane, where the voltage level represents the value of one or more bits of data. Thus "encoding a symbol" means physically configuring a line driver circuit of the serial data bus to drive the voltage on the data lane to a particular value.

Figure 3:
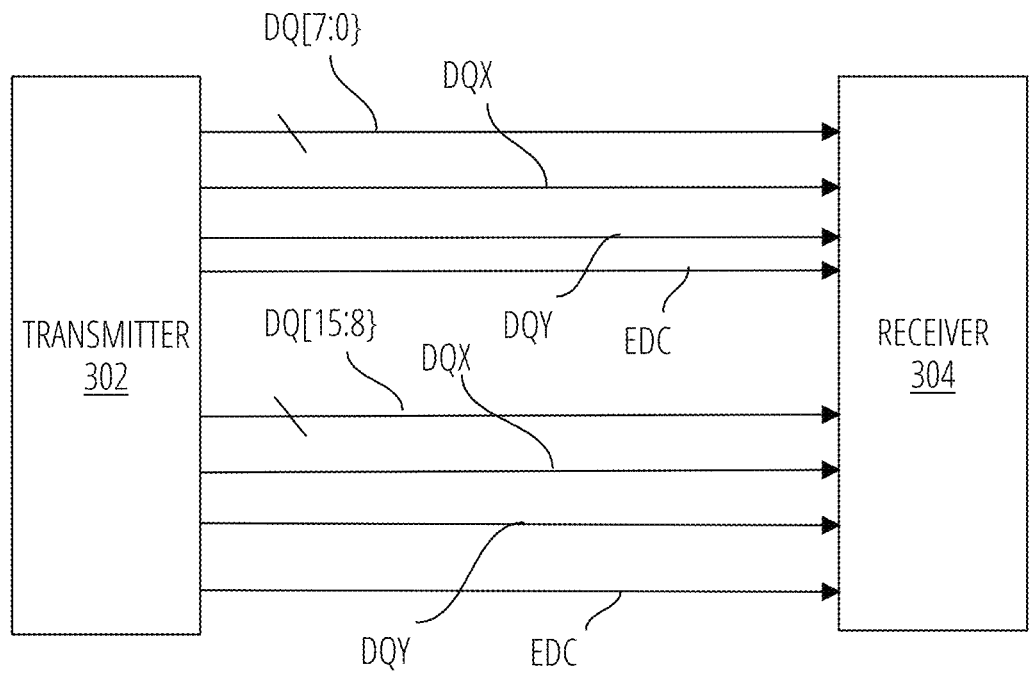
FIG. 3 depicts a system in accordance with one embodiment.

FIG. 3 depicts a system comprising a transmitter 302, a receiver 304, and two sets of eight parallel data channels DQ [7:0] and DQ [15:8] coupling the transmitter 302 to the receiver 304. Each set of data channels has two associated auxiliary data channels DQX and DQY and an error correction channel EDC (also called DQE). In accordance with the embodiments disclosed herein, the system may include logic (e.g., in the transmitter or in a distinct controller that operates the transmitter) to communicate bursts of PAM-3 symbols encoded in accordance with the techniques described herein, e.g., 11b7s, 3b2s, and combinations thereof.

Figure 4:
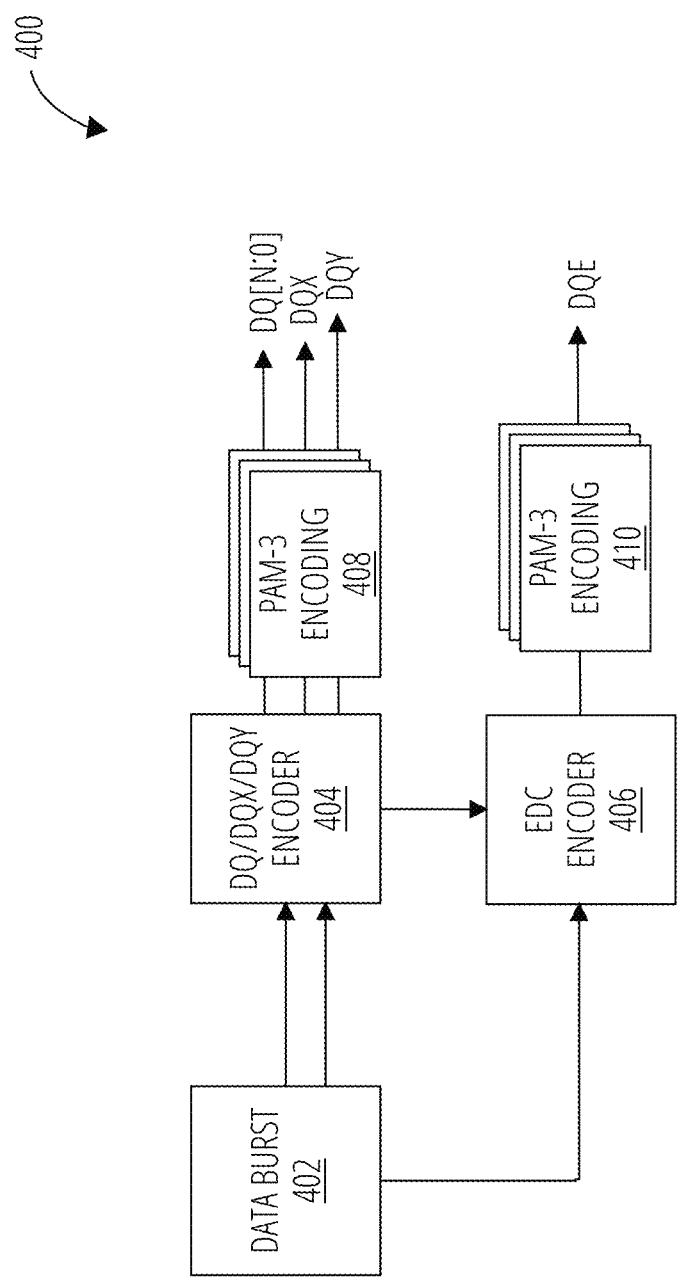
FIG. 4 depicts a burst read system 400 in accordance with one embodiment.

FIG. 4 depicts a burst read system 400 in one embodiment. A data burst 402 from a memory device is input to both of a DQ/DQX/DQY encoder 404 and an EDC encoder 406 (e.g., in parallel) and transformed into PAM-3 encoding 408 and PAM-3 encoding 410 which together represent a transmission of both the data burst 402 and a CRC for the data burst 402 on the DQ [N:0]/DQX channels and EDC channels, respectively.

Figure 5:
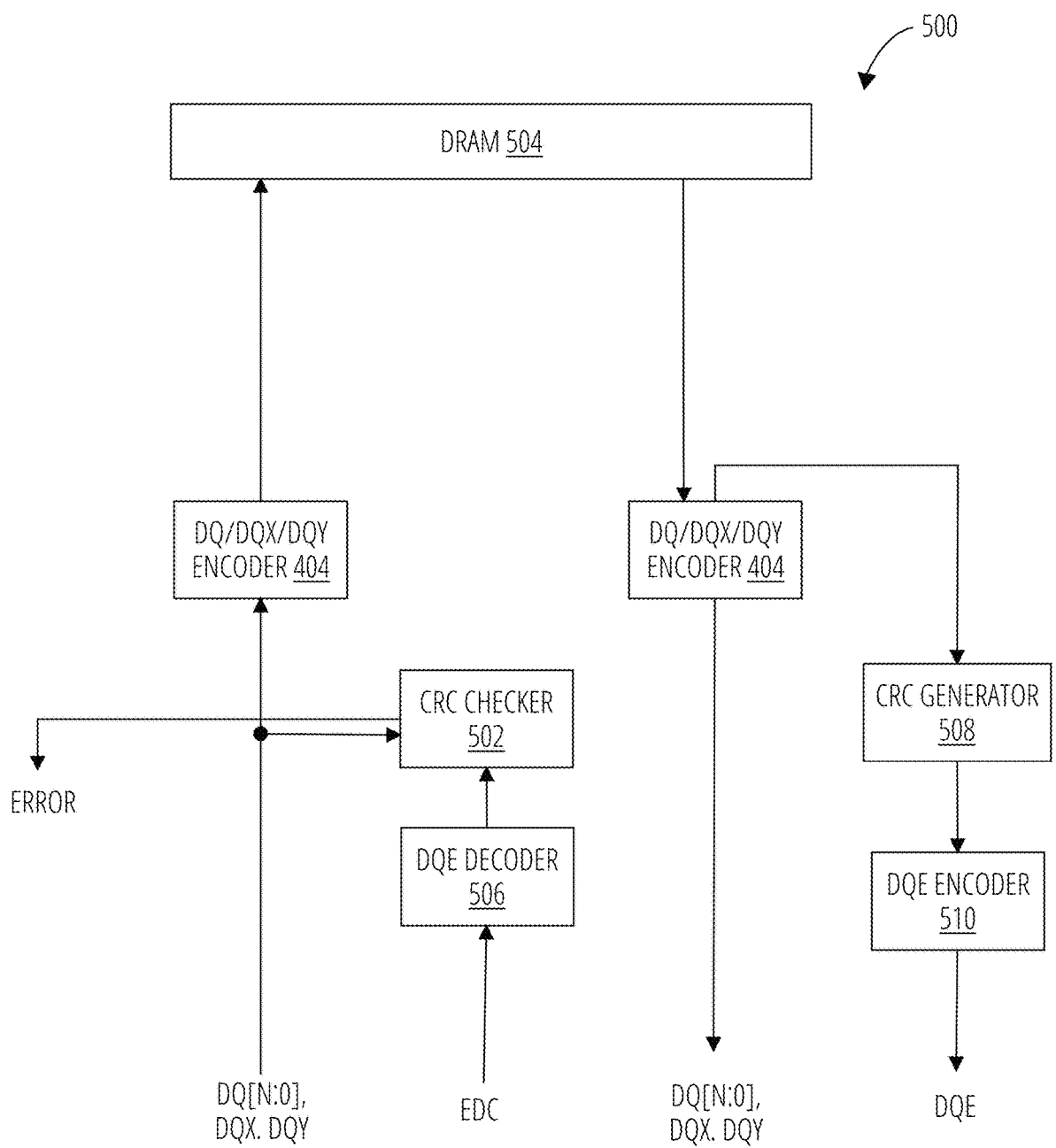
FIG. 5 depicts a machine memory system 500 in accordance with one embodiment.

FIG. 5 depicts a machine memory system 500 in one embodiment. The machine memory system 500 may for example be a GDDR SGRAM.

Data for WRITE operations undergoes a CRC check by the CRC checker 502, and is decoded by a DQ/DQX/DQY encoder 404 before being written to the DRAM 504. The CRC checker 502 operates on the DQ/DQX/DQY channel data bits and also on the DQE channel bits output from the DQE decoder 506. On READ operations from the DRAM 504, a CRC is generated for the data bits by the CRC generator 508, the data bits are encoded onto the DQ/DQX/DQY lines by the DQ/DQX/DQY encoder 404, and the CRC is encoded onto the DQE channel by the DQE encoder 510.

Figures 6A, 6B:
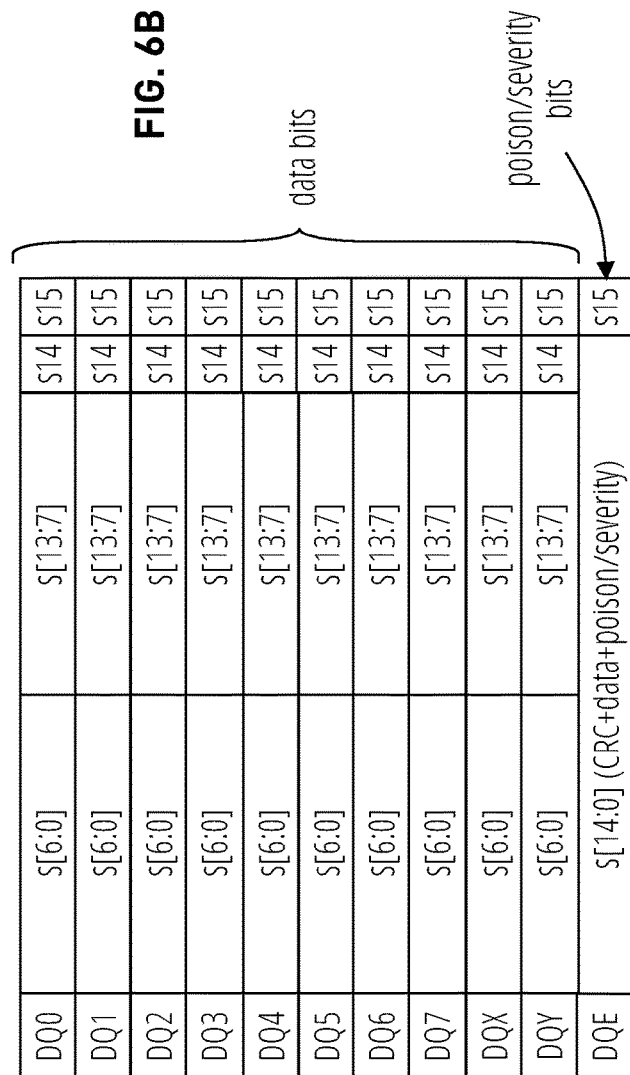
FIG. 6A and FIG. 6B depict an exemplary PAM-3 encoding and symbol distribution over the various DQ/DQX/DQY/DQE channels.

FIG. 6A and FIG. 6B depict an exemplary PAM-3 encoding and symbol distribution over the various DQ/DQX/DQY/DQE channels. For both the raw data and the encoded data (symbols), each row DQ [i] represents a serial data channel. In the raw data, the columns are sequential bit positions in 32-bit data bursts. For example, 11 sequential bits are represented in the column labeled b [10:0]. Each burst of 32 bits is represented on each serial DQ channel as three sets of 11 bits, 11 bits, and 10 bits each. For example, on DQ [0], in FIG. 6A the 32-bit double burst is conceptually divided into a first part b [10:0], a second part b [21:11], and a third part b [22:31]; FIG. 6B depicts the corresponding encoding of these bits into symbols on DX [0]. In FIG. 6B s [6:0] represents seven symbols encoding the raw bits b [10:0]. A total of 16 symbols are utilized to encode the 256 bits of raw data in the burst. The raw data values are mapped onto the DQ, DQX, DQY, and DQE channels as PAM-3 symbols as depicted, with a mixture of 11b7s and 3b2s encodings in accordance with the embodiments previously described.

Figure 7A:
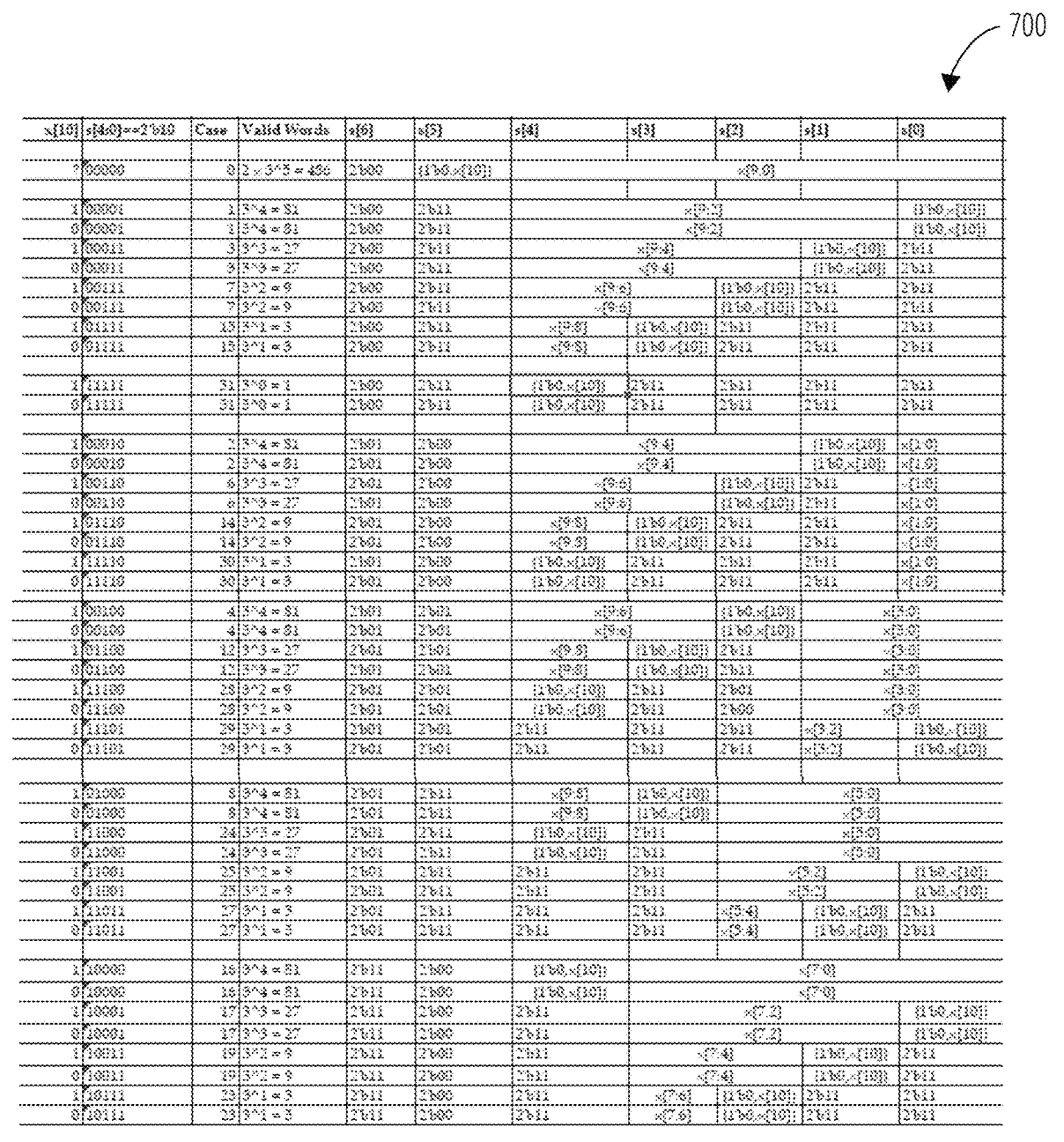
Figure 7B:
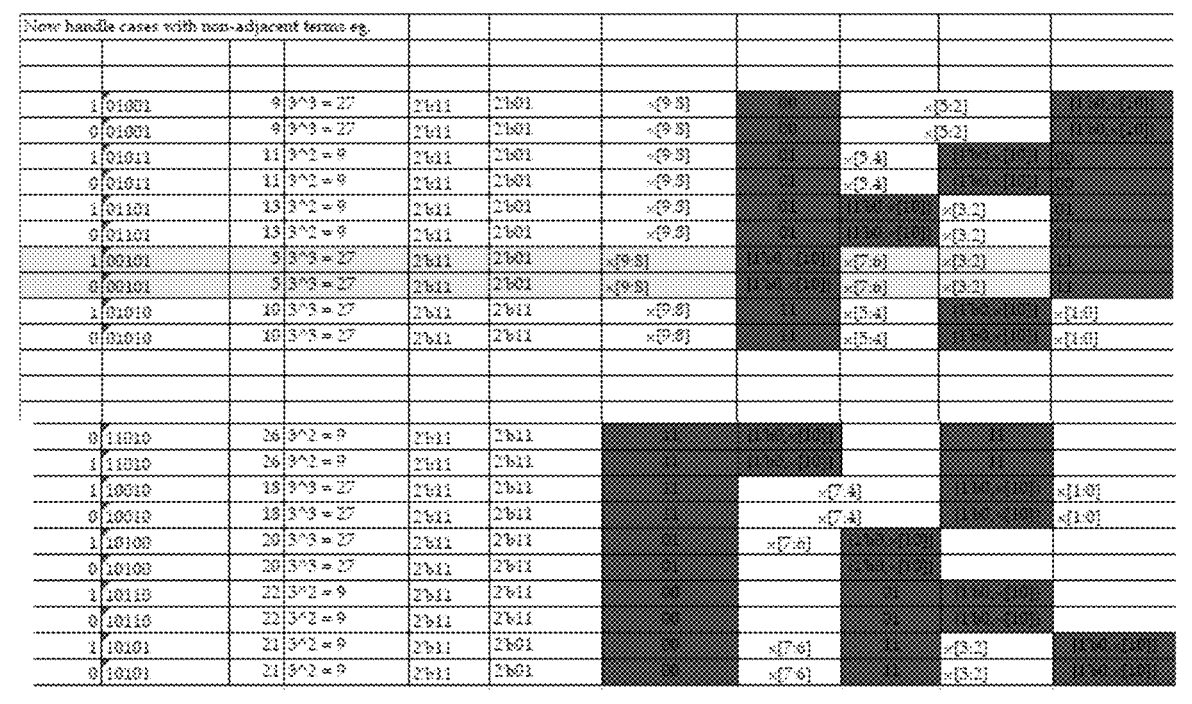

FIG. 7A and FIG. 7B depict logic 700 for a PAM-3 encoder in one embodiment. Exemplary algorithms to implement such logic (both encoding and decoding) are provided in Listing I and Listing II.

PAM-3 encodings in accordance with the techniques disclosed herein, utilizing DQ, DQX, DQY, and DQE channels, may achieve transmission rates of >90%, and even 99% or greater, of the transmission rate of PAM-4 techniques over DQ, DQX, and DQE, but may be implemented with significantly less circuit area and complexity (this may also translate into power savings). PAM-3 may achieve a wider signal eye than PAM-4, and may enable voltage scaling to reduce power during transmissions (e.g., for applications such as mobile devices).

The algorithms and techniques disclosed herein may be executed by computing devices utilizing one or more graphic processing unit (GPU) and/or general purpose data processor (e.g., a 'central processing unit or CPU). Exemplary architectures will now be described that may be configured to carry out the techniques disclosed herein on such devices. In particular encoding techniques in accordance with the embodiments described herein may be utilized anywhere data or instructions are communicated between components of the exemplary systems described below (e.g., between a data parallel processing unit 802 and a memory 804, over a crossbar 806, between a parallel processing unit 1202 and a memory 1204, between a central processing unit 1206 and a parallel processing unit 1202, etc.).

The following description may use certain acronyms and abbreviations as follows:

"DPC" refers to a "data processing cluster";
"GPC" refers to a "general processing cluster";
"I/O" refers to a "input/output";
"L1 cache" refers to "level one cache";
"L2 cache" refers to "level two cache";
"LSU" refers to a "load/store unit";
"MMU" refers to a "memory management unit";
"MPC" refers to an "M-pipe controller";
"PPU" refers to a "parallel processing unit";
"PROP" refers to a "pre-raster operations unit";
"ROP" refers to a "raster operations";
"SFU" refers to a "special function unit";
"SM" refers to a "streaming multiprocessor";
"Viewport SCC" refers to "viewport scale, cull, and clip";
"WDX" refers to a "work distribution crossbar"; and
"XBar" refers to a "crossbar".

Parallel Processing Unit

Figure 8:
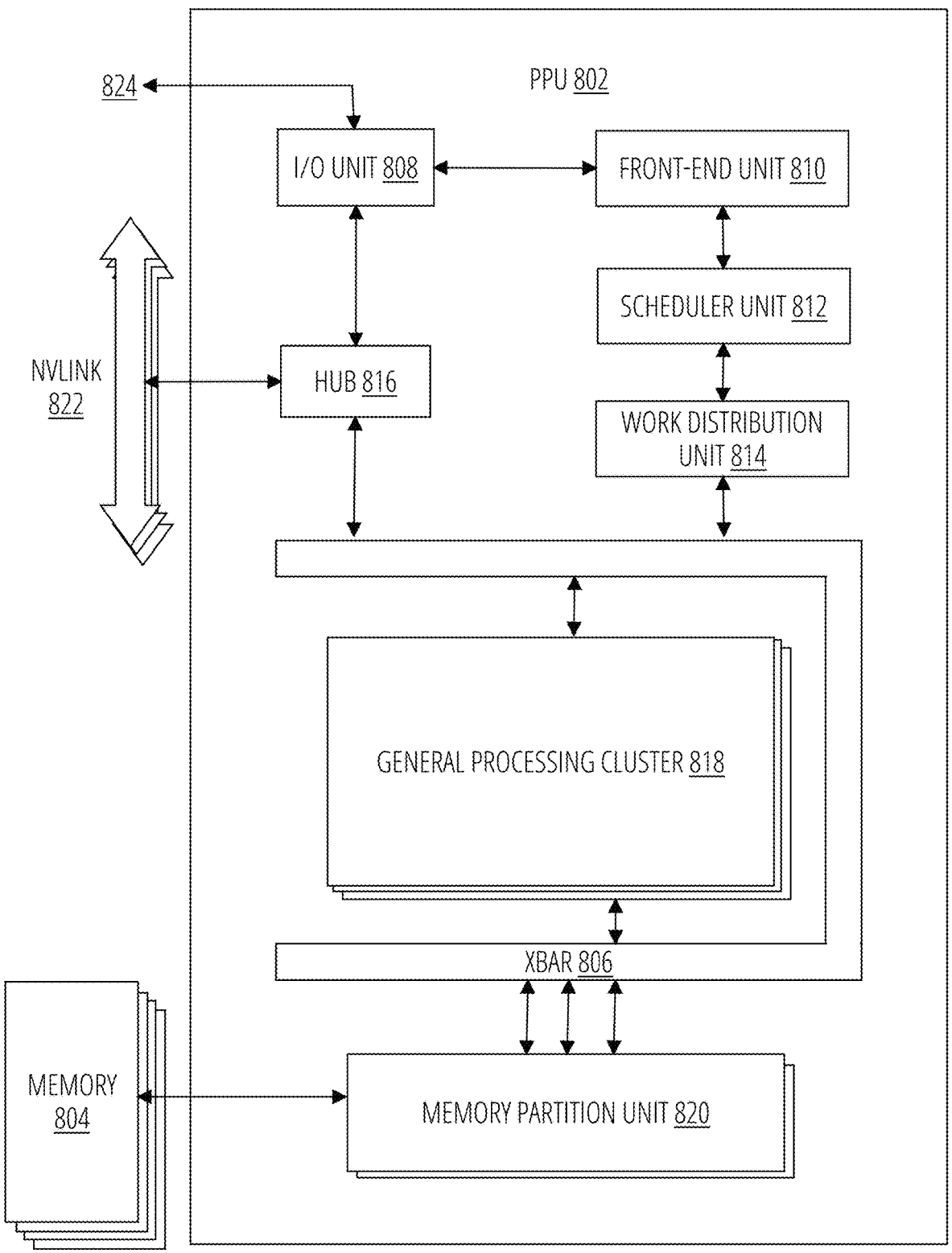
FIG. 8 depicts a parallel processing unit 802 in accordance with one embodiment.

FIG. 8 depicts a parallel processing unit 802 in accordance with an embodiment. In an embodiment, the parallel processing unit 802 is a multi-threaded processor that is implemented on one or more integrated circuit devices. The parallel processing unit 802 is a latency hiding architecture designed to process many threads in parallel. A thread (e.g., a thread of execution) is an instantiation of a set of instructions configured to be executed by the parallel processing unit 802. In an embodiment, the parallel processing unit 802 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 802 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 802 modules may be configured to accelerate thousands of High Performance Computing (HPC), data center, and machine learning applications. The parallel processing unit 802 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 8, the parallel processing unit 802 includes an I/O unit 808, a front-end unit 810, a scheduler unit 812, a work distribution unit 814, a hub 816, a crossbar 806, one or more general processing cluster 818 modules, and one or more memory partition unit 820 modules. The parallel processing unit 802 may be coupled to a host processor or other modules via one or more high-speed NVLink 822 interconnects. The parallel processing unit 802 may be coupled to a host processor or other peripheral devices via an interconnect 824. The parallel processing unit 802 may also be coupled to a local memory comprising a number of memory 804 devices. In an embodiment, the local memory may comprise a number of dynamic random access memory (DRAM) devices, such as GDDR SGRAM devices. The DRAM devices may be configured as a high-bandwidth memory (HBM) subsystem, with multiple DRAM dies stacked within each device. In one embodiment, the memory 804 and the parallel processing unit 802 may communicate using the PAM-3 techniques disclosed herein.

The NVLink 822 interconnect (which may utilize embodiments of the techniques disclosed herein) enables systems to scale and include one or more parallel processing unit 802 modules combined with one or more CPUs, supports cache coherence between the parallel processing unit 802 modules and CPUs, and CPU mastering. Data and/or commands may be transmitted by the NVLink 822 through the hub 816 to/from other units of the parallel processing unit 802 such as one or more copy engines, a video encoder, a video decoder, a power management unit, etc. (not explicitly shown).

The I/O unit 808 is configured to transmit and receive communications (e.g., commands, data, etc.) from a host processor (not shown) over the interconnect 824. The I/O unit 808 may communicate with the host processor directly via the interconnect 824 or through one or more intermediate devices such as a memory bridge. In an embodiment, the I/O unit 808 may communicate with one or more other processors, such as one or more parallel processing unit 802 modules via the interconnect 824. In an embodiment, the I/O unit 808 implements a Peripheral Component Interconnect Express (PCIe) interface for communications over a PCIe bus and the interconnect 824 is a PCIe bus. In alternative embodiments, the I/O unit 808 may implement other types of well-known interfaces for communicating with external devices.

The I/O unit 808 decodes packets received via the interconnect 824. In an embodiment, the packets represent commands configured to cause the parallel processing unit 802 to perform various operations. The I/O unit 808 transmits the decoded commands to various other units of the parallel processing unit 802 as the commands may specify. For example, some commands may be transmitted to the front-end unit 810. Other commands may be transmitted to the hub 816 or other units of the parallel processing unit 802 such as one or more copy engines, a video encoder, a video decoder, a power management unit, etc. (not explicitly shown). In other words, the I/O unit 808 is configured to route communications between and among the various logical units of the parallel processing unit 802.

In an embodiment, a program executed by the host processor encodes a command stream in a buffer that provides workloads to the parallel processing unit 802 for processing. A workload may comprise several instructions and data to be processed by those instructions. The buffer is a region in a memory that is accessible (e.g., read/write) by both the host processor and the parallel processing unit 802. For example, the I/O unit 808 may be configured to access the buffer in a system memory connected to the interconnect 824 via memory requests transmitted over the interconnect 824. In an embodiment, the host processor writes the command stream to the buffer and then transmits a pointer to the start of the command stream to the parallel processing unit 802. The front-end unit 810 receives pointers to one or more command streams. The front-end unit 810 manages the one or more streams, reading commands from the streams and forwarding commands to the various units of the parallel processing unit 802.

The front-end unit 810 is coupled to a scheduler unit 812 that configures the various general processing cluster 818 modules to process tasks defined by the one or more streams. The scheduler unit 812 is configured to track state information related to the various tasks managed by the scheduler unit 812. The state may indicate which general processing cluster 818 a task is assigned to, whether the task is active or inactive, a priority level associated with the task, and so forth. The scheduler unit 812 manages the execution of a plurality of tasks on the one or more general processing cluster 818 modules.

The scheduler unit 812 is coupled to a work distribution unit 814 that is configured to dispatch tasks for execution on the general processing cluster 818 modules. The work distribution unit 814 may track a number of scheduled tasks received from the scheduler unit 812. In an embodiment, the work distribution unit 814 manages a pending task pool and an active task pool for each of the general processing cluster 818 modules. The pending task pool may comprise a number of slots (e.g., 32 slots) that contain tasks assigned to be processed by a particular general processing cluster 818. The active task pool may comprise a number of slots (e.g., 4 slots) for tasks that are actively being processed by the general processing cluster 818 modules. As a general processing cluster 818 finishes the execution of a task, that task is evicted from the active task pool for the general processing cluster 818 and one of the other tasks from the pending task pool is selected and scheduled for execution on the general processing cluster 818. If an active task has been idle on the general processing cluster 818, such as while waiting for a data dependency to be resolved, then the active task may be evicted from the general processing cluster 818 and returned to the pending task pool while another task in the pending task pool is selected and scheduled for execution on the general processing cluster 818.

The work distribution unit 814 communicates with the one or more general processing cluster 818 modules via crossbar 806. The crossbar 806 is an interconnect network that couples many of the units of the parallel processing unit 802 to other units of the parallel processing unit 802. For example, the crossbar 806 may be configured to couple the work distribution unit 814 to a particular general processing cluster 818. Although not shown explicitly, one or more other units of the parallel processing unit 802 may also be connected to the crossbar 806 via the hub 816.

The tasks are managed by the scheduler unit 812 and dispatched to a general processing cluster 818 by the work distribution unit 814. The general processing cluster 818 is configured to process the task and generate results. The results may be consumed by other tasks within the general processing cluster 818, routed to a different general processing cluster 818 via the crossbar 806, or stored in the memory 804. The results can be written to the memory 804 via the memory partition unit 820 modules, which implement a memory interface and logic (e.g., PAM-3 encoding logic in accordance with the disclosed techniques) for reading and writing data to/from the memory 804. The results can be transmitted to another parallel processing unit 802 or CPU via the NVLink 822. In an embodiment, the parallel processing unit 802 includes a number U of memory partition unit 820 modules that is equal to the number of separate and distinct memory 804 devices coupled to the parallel processing unit 802. A memory partition unit 820 will be described in more detail below in conjunction with FIG. 10.

In an embodiment, a host processor executes a driver kernel that implements an application programming interface (API) that enables one or more applications executing on the host processor to schedule operations for execution on the parallel processing unit 802. In an embodiment, multiple compute applications are simultaneously executed by the parallel processing unit 802 and the parallel processing unit 802 provides isolation, quality of service (QoS), and independent address spaces for the multiple compute applications. An application may generate instructions (e.g., API calls) that cause the driver kernel to generate one or more tasks for execution by the parallel processing unit 802. The driver kernel outputs tasks to one or more streams being processed by the parallel processing unit 802. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 11.

Figure 9:
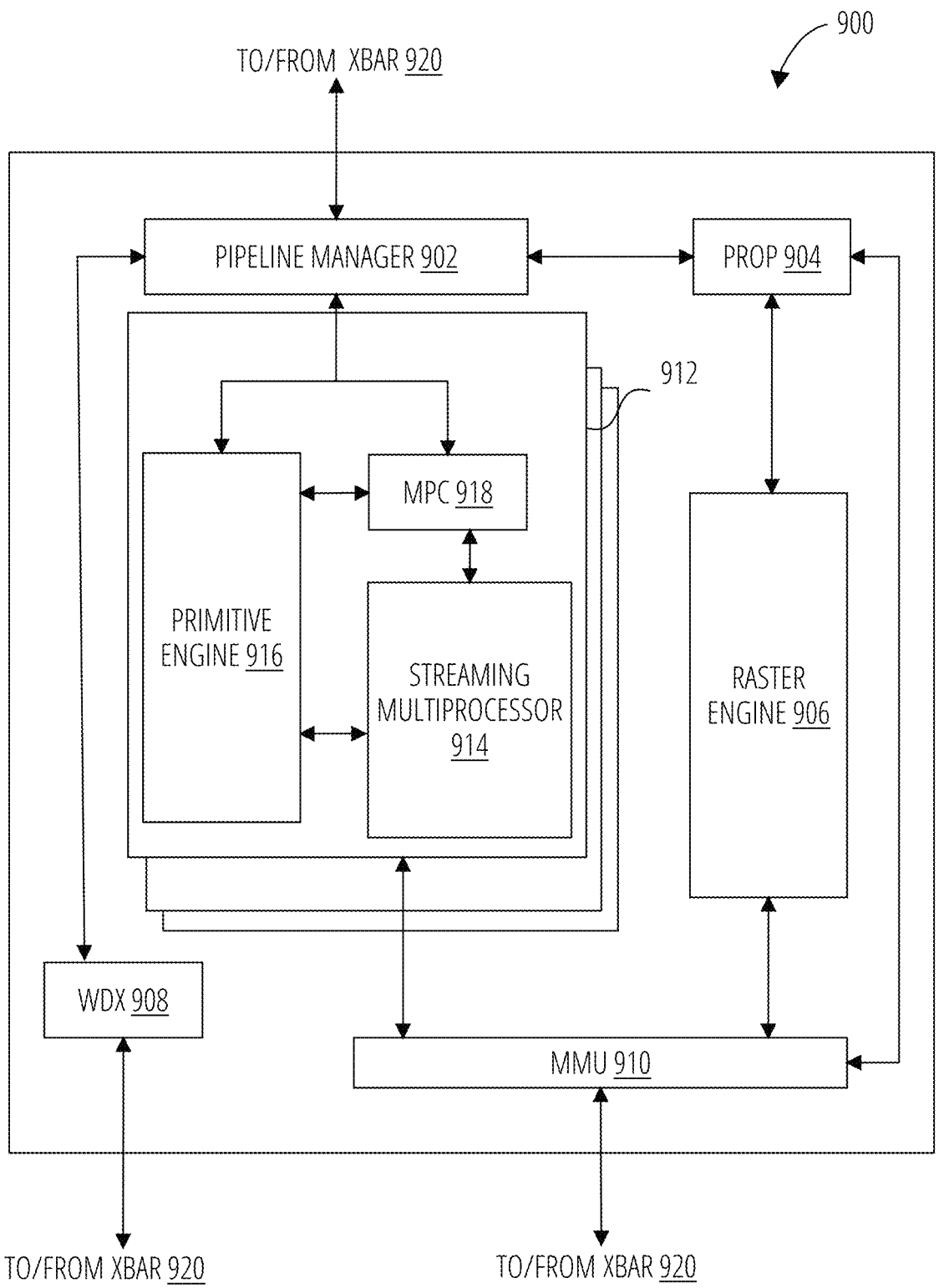
FIG. 9 depicts a general processing cluster 900 in accordance with one embodiment.

FIG. 9 depicts a general processing cluster 900 of the parallel processing unit 802 FIG. 8, in accordance with an embodiment. The general processing cluster 900 exchanges signals with other system components via a crossbar 920. As shown in FIG. 9, each general processing cluster 900 includes a number of hardware units for processing tasks. In an embodiment, each general processing cluster 900 includes a pipeline manager 902, a pre-raster operations unit 904, a raster engine 906, a work distribution crossbar 908, a memory management unit 910, and one or more data processing cluster 912. It will be appreciated that the general processing cluster 900 of FIG. 9 may include other hardware units in lieu of or in addition to the units shown in FIG. 9.

In an embodiment, the operation of the general processing cluster 900 is controlled by the pipeline manager 902. The pipeline manager 902 manages the configuration of the one or more data processing cluster 912 modules for processing tasks allocated to the general processing cluster 900. In an embodiment, the pipeline manager 902 may configure at least one of the one or more data processing cluster 912 modules to implement at least a portion of a graphics rendering pipeline. For example, a data processing cluster 912 may be configured to execute a vertex shader program on the programmable streaming multiprocessor 914. The pipeline manager 902 may also be configured to route packets received from the work distribution unit 814 to the appropriate logical units within the general processing cluster 900. For example, some packets may be routed to fixed function hardware units in the pre-raster operations unit 904 and/or raster engine 906 while other packets may be routed to the data processing cluster 912 modules for processing by the primitive engine 916 or the streaming multiprocessor 914. In an embodiment, the pipeline manager 902 may configure at least one of the one or more data processing cluster 912 modules to implement a neural network model and/or a computing pipeline.

Figure 10:
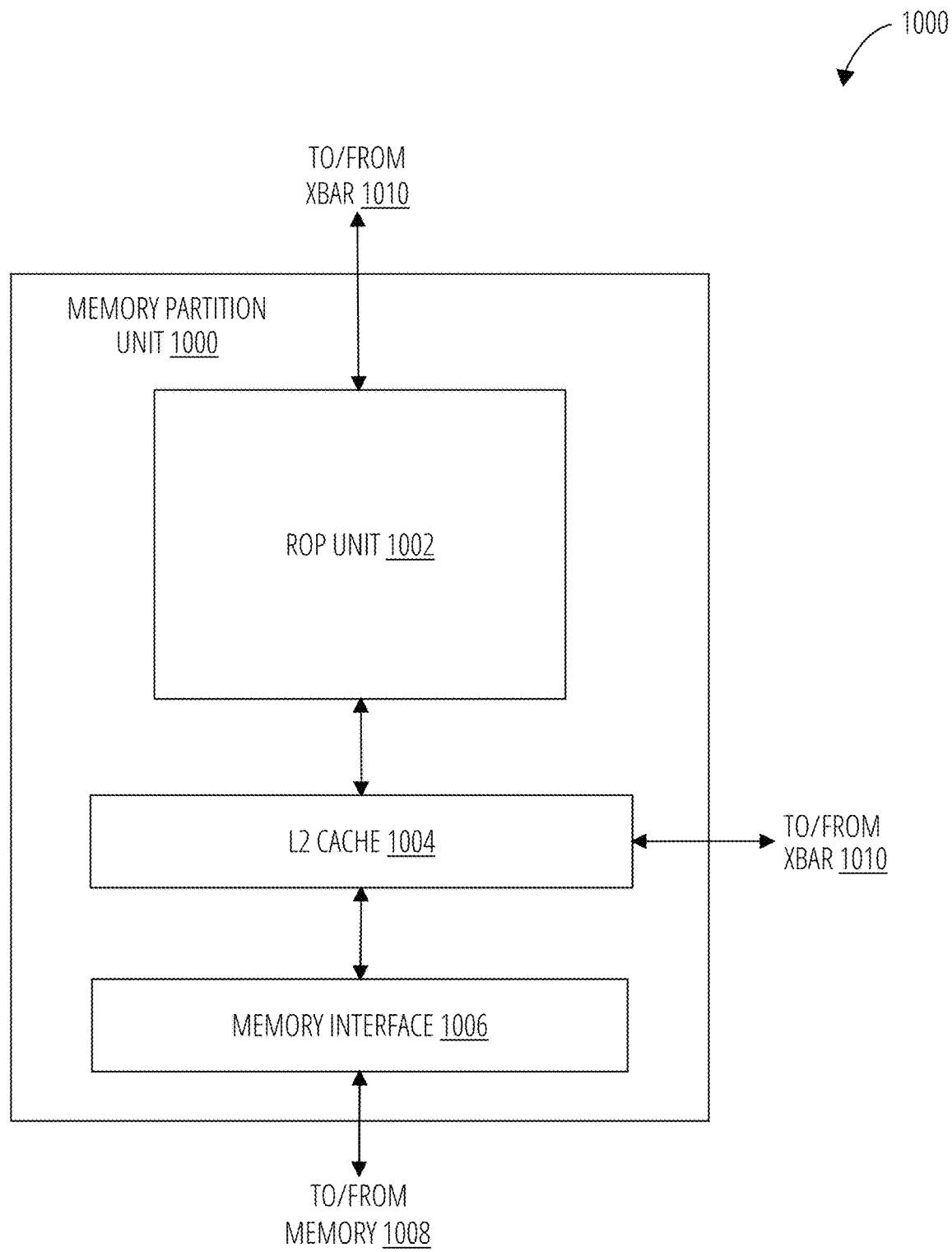
FIG. 10 depicts a memory partition unit 1000 in accordance with one embodiment.

The pre-raster operations unit 904 is configured to route data generated by the raster engine 906 and the data processing cluster 912 modules to a Raster Operations (ROP) unit, described in more detail in conjunction with FIG. 10. The pre-raster operations unit 904 may also be configured to perform optimizations for color blending, organize pixel data, perform address translations, and the like.

The raster engine 906 includes a number of fixed function hardware units configured to perform various raster operations. In an embodiment, the raster engine 906 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 906 comprises fragments to be processed, for example, by a fragment shader implemented within a data processing cluster 912.

Each data processing cluster 912 included in the general processing cluster 900 includes an M-pipe controller 918, a primitive engine 916, and one or more streaming multiprocessor 914 modules. The M-pipe controller 918 controls the operation of the data processing cluster 912, routing packets received from the pipeline manager 902 to the appropriate units in the data processing cluster 912. For example, packets associated with a vertex may be routed to the primitive engine 916, which is configured to fetch vertex attributes associated with the vertex from the memory 804. In contrast, packets associated with a shader program may be transmitted to the streaming multiprocessor 914.

The streaming multiprocessor 914 comprises a programmable streaming processor that is configured to process tasks represented by a number of threads. Each streaming multiprocessor 914 is multi-threaded and configured to execute a plurality of threads (e.g., 32 threads) from a particular group of threads concurrently. In an embodiment, the streaming multiprocessor 914 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the streaming multiprocessor 914 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The streaming multiprocessor 914 will be described in more detail below in conjunction with FIG. 11).

The memory management unit 910 provides an interface between the general processing cluster 900 and the memory partition unit 1000. The memory management unit 910 may provide translation of virtual addresses into physical addresses, memory protection, and arbitration of memory requests. In an embodiment, the memory management unit 910 provides one or more translation lookaside buffers (TLBs) for performing translation of virtual addresses into physical addresses in the memory 804.

FIG. 10 depicts a memory partition unit 1000 of the parallel processing unit 802 of FIG. 8, in accordance with an embodiment. As shown in FIG. 10, the memory partition unit 1000 includes a raster operations unit 1002, a level two cache 1004, and a memory interface 1006. The memory interface 1006 is coupled to the memory 1008. Memory interface 1006 may implement 32, 64, 128, 1024-bit data buses, or the like, for high-speed data transfer. The memory interface 1006 may comprise logic to perform PAM-3 encoding/decoding in accordance with the disclosed embodiments. In an embodiment, the parallel processing unit 802 incorporates U memory interface 1006 modules, one memory interface 1006 per pair of memory partition unit 1000 modules, where each pair of memory partition unit 1000 modules is connected to a corresponding memory 1008 device. For example, parallel processing unit 802 may be connected to up to Y memory 1008 devices, such as high bandwidth memory stacks or graphics double-data-rate, version 5, synchronous dynamic random access memory, or other types of persistent storage.

In an embodiment, the memory interface 1006 implements an HBM2 memory interface and Y equals half U. In an embodiment, the HBM2 memory stacks are located on the same physical package as the parallel processing unit 802, providing substantial power and area savings compared with conventional GDDR SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 1008 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 802 modules process very large datasets and/or run applications for extended periods.

In an embodiment, the parallel processing unit 802 implements a multi-level memory hierarchy. In an embodiment, the memory partition unit 1000 supports a unified memory to provide a single unified virtual address space for CPU and parallel processing unit 802 memory, enabling data sharing between virtual memory systems. In an embodiment the frequency of accesses by a parallel processing unit 802 to memory located on other processors is traced to ensure that memory pages are moved to the physical memory of the parallel processing unit 802 that is accessing the pages more frequently. In an embodiment, the NVLink 822 supports address translation services allowing the 802 to directly access a CPU's page tables and providing full access to CPU memory by the parallel processing unit 802.

In an embodiment, copy engines transfer data between multiple parallel processing unit 802 modules or between parallel processing unit 802 modules and CPUs. The copy engines can generate page faults for addresses that are not mapped into the page tables. The memory partition unit 1000 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 1008 or other system memory may be fetched by the memory partition unit 1000 and stored in the level two cache 1004, which is located on-chip and is shared between the various general processing clusters 900. As shown, each memory partition unit 1000 includes a portion of the level two cache 1004 associated with a corresponding memory 1008 device. Lower level caches may then be implemented in various units within the general processing clusters 900. For example, each of the streaming multiprocessors 1100 may implement an L1 cache. The L1 cache is private memory that is dedicated to a particular streaming multiprocessor 1100. Data from the level two cache 1004 may be fetched and stored in each of the L1 caches for processing in the functional units of the streaming multiprocessors 1100. The level two cache 1004 is coupled to the memory interface 1006 and the crossbar 1010.

The raster operations unit 1002 performs graphics raster operations related to pixel color, such as color compression, pixel blending, and the like. The raster operations unit 1002 also implements depth testing in conjunction with the raster engine 906, receiving a depth for a sample location associated with a pixel fragment from the culling engine of the raster engine 906. The depth is tested against a corresponding depth in a depth buffer for a sample location associated with the fragment. If the fragment passes the depth test for the sample location, then the raster operations unit 1002 updates the depth buffer and transmits a result of the depth test to the raster engine 906. It will be appreciated that the number of partition memory partition unit 1000 modules may be different than the number of general processing clusters 900 and, therefore, each raster operations unit 1002 may be coupled to each of the general processing clusters 900. The raster operations unit 1002 tracks packets received from the different general processing clusters 900 and determines which general processing cluster 900 that a result generated by the raster operations unit 1002 is routed to through the crossbar 1010. Although the raster operations unit 1002 is included within the memory partition unit 1000 in FIG. 10, in other embodiment, the raster operations unit 1002 may be outside of the memory partition unit 1000. For example, the raster operations unit 1002 may reside in the general processing cluster 900 or another unit.

Figure 11:
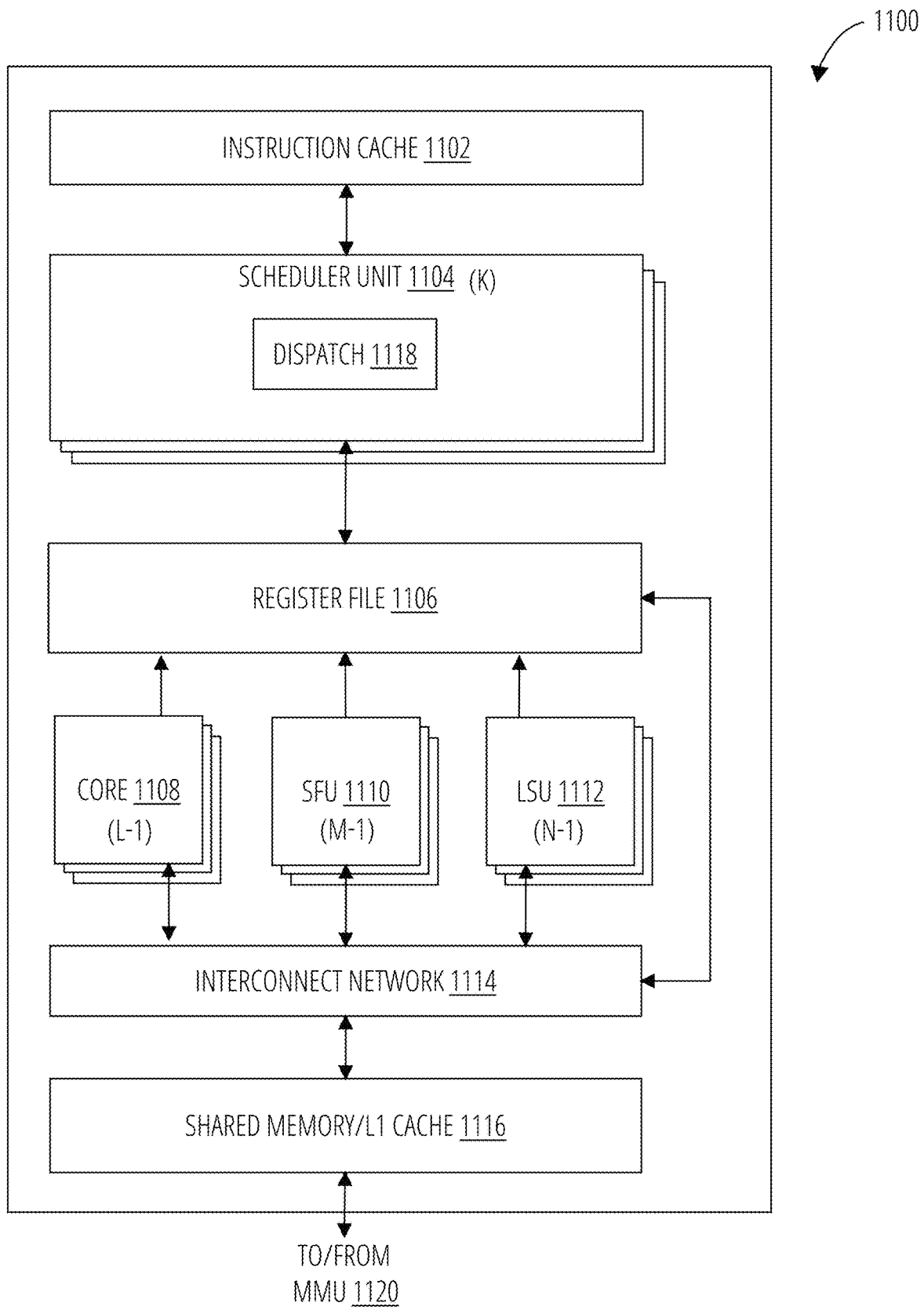
FIG. 11 depicts a streaming multiprocessor 1100 in accordance with one embodiment.

FIG. 11 illustrates the streaming multiprocessor 1100 of FIG. 9, in accordance with an embodiment. The streaming multiprocessor 1100 exchanges signals with a memory management unit 1120. As shown in FIG. 11, the streaming multiprocessor 1100 includes an instruction cache 1102, one or more scheduler unit 1104 modules (e.g., such as scheduler unit 812), a register file 1106, one or more processing core 1108 modules, one or more special function unit 1110 modules, one or more load/store unit 1112 modules, an interconnect network 1114, and a shared memory/L1 cache 1116.

As described above, the work distribution unit 814 dispatches tasks for execution on the general processing clusters 900 of the parallel processing unit 802. The tasks are allocated to a particular data processing cluster 912 within a general processing cluster 900 and, if the task is associated with a shader program, the task may be allocated to a streaming multiprocessor 1100. The scheduler unit 812 receives the tasks from the work distribution unit 814 and manages instruction scheduling for one or more thread blocks assigned to the streaming multiprocessor 1100. The scheduler unit 1104 schedules thread blocks for execution as warps of parallel threads, where each thread block is allocated at least one warp. In an embodiment, each warp executes 32 threads. The scheduler unit 1104 may manage a plurality of different thread blocks, allocating the warps to the different thread blocks and then dispatching instructions from the plurality of different cooperative groups to the various functional units (e.g., core 1108 modules, special function unit 1110 modules, and load/store unit 1112 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads ( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1118 unit is configured within the scheduler unit 1104 to transmit instructions to one or more of the functional units. In one embodiment, the scheduler unit 1104 includes two dispatch 1118 units that enable two different instructions from the same warp to be dispatched during each clock cycle. In alternative embodiments, each scheduler unit 1104 may include a single dispatch 1118 unit or additional dispatch 1118 units.

Each streaming multiprocessor 1100 includes a register file 1106 that provides a set of registers for the functional units of the streaming multiprocessor 1100. In an embodiment, the register file 1106 is divided between each of the functional units such that each functional unit is allocated a dedicated portion of the register file 1106. In another embodiment, the register file 1106 is divided between the different warps being executed by the streaming multiprocessor 1100. The register file 1106 provides temporary storage for operands connected to the data paths of the functional units.

Each streaming multiprocessor 1100 comprises L processing core 1108 modules. In an embodiment, the streaming multiprocessor 1100 includes a large number (e.g., 128, etc.) of distinct processing core 1108 modules. Each core 1108 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1108 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1108 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each streaming multiprocessor 1100 also comprises M special function unit 1110 modules that perform special functions (e.g., attribute evaluation, reciprocal square root, and the like). In an embodiment, the special function unit 1110 modules may include a tree traversal unit configured to traverse a hierarchical tree data structure. In an embodiment, the special function unit 1110 modules may include texture unit configured to perform texture map filtering operations. In an embodiment, the texture units are configured to load texture maps (e.g., a 2D array of texels) from the memory 804 and sample the texture maps to produce sampled texture values for use in shader programs executed by the streaming multiprocessor 1100. In an embodiment, the texture maps are stored in the shared memory/L1 cache 1116. The texture units implement texture operations such as filtering operations using mip-maps (e.g., texture maps of varying levels of detail). In an embodiment, each streaming multiprocessor 1100 includes two texture units.

Each streaming multiprocessor 1100 also comprises N load/store unit 1112 modules that implement load and store operations between the shared memory/L1 cache 1116 and the register file 1106. Each streaming multiprocessor 1100 includes an interconnect network 1114 that connects each of the functional units to the register file 1106 and the load/store unit 1112 to the register file 1106 and shared memory/L1 cache 1116. In an embodiment, the interconnect network 1114 is a crossbar that can be configured to connect any of the functional units to any of the registers in the register file 1106 and connect the load/store unit 1112 modules to the register file 1106 and memory locations in shared memory/L1 cache 1116.

The shared memory/L1 cache 1116 is an array of on-chip memory that allows for data storage and communication between the streaming multiprocessor 1100 and the primitive engine 916 and between threads in the streaming multiprocessor 1100. In an embodiment, the shared memory/L1 cache 1116 comprises 128 KB of storage capacity and is in the path from the streaming multiprocessor 1100 to the memory partition unit 1000. The shared memory/L1 cache 1116 can be used to cache reads and writes. One or more of the shared memory/L1 cache 1116, level two cache 1004, and memory 804 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1116 enables the shared memory/L1 cache 1116 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 8, are bypassed, creating a much simpler programming model. In the general purpose parallel computation configuration, the work distribution unit 814 assigns and distributes blocks of threads directly to the data processing cluster 912 modules. The threads in a block execute the same program, using a unique thread ID in the calculation to ensure each thread generates unique results, using the streaming multiprocessor 1100 to execute the program and perform calculations, shared memory/L1 cache 1116 to communicate between threads, and the load/store unit 1112 to read and write global memory through the shared memory/L1 cache 1116 and the memory partition unit 1000. When configured for general purpose parallel computation, the streaming multiprocessor 1100 can also write commands that the scheduler unit 812 can use to launch new work on the data processing clusters 912.

The parallel processing unit 802 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 802 is embodied on a single semiconductor substrate. In another embodiment, the parallel processing unit 802 is included in a system-on-a-chip (SoC) along with one or more other devices such as additional parallel processing units 802, the memory 804, a reduced instruction set computer (RISC) CPU, a memory management unit (MMU), a digital-to-analog converter (DAC), and the like.

In an embodiment, the parallel processing unit 802 may be included on a graphics card that includes one or more memory devices. The graphics card may be configured to interface with a PCIe slot on a motherboard of a desktop computer. In yet another embodiment, the parallel processing unit 802 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 12:
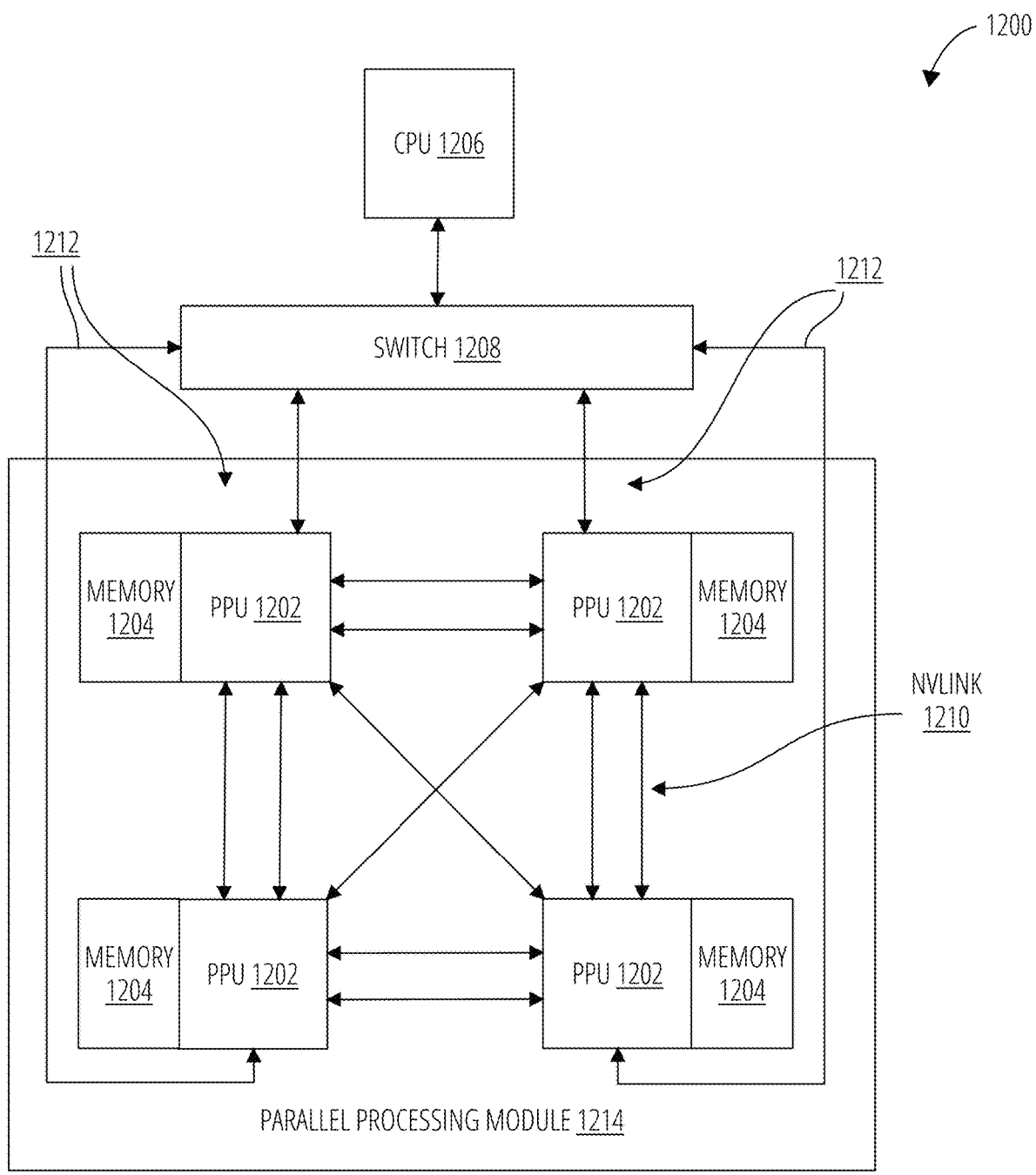
FIG. 12 depicts a processing system 1200 in accordance with one embodiment.

FIG. 12 is a conceptual diagram of a processing system 1200 implemented using the parallel processing unit 1202 of FIG. 8, in accordance with an embodiment. The processing system 1200 includes a central processing unit 1206, switch 1208, and multiple parallel processing unit 1202 modules each and respective memory 1204 modules. The NVLink 1210 provides high-speed communication links between each of the parallel processing unit 1202 modules. Although a particular number of NVLink 1210 and interconnect 1212 connections are illustrated in FIG. 12, the number of connections to each parallel processing unit 1202 and the central processing unit 1206 may vary. The switch 1208 interfaces between the interconnect 1212 and the central processing unit 1206. The parallel processing unit 1202 modules, memory 1204 modules, and NVLink 1210 connections may be situated on a single semiconductor platform to form a parallel processing module 1214. In an embodiment, the switch 1208 supports two or more protocols to interface between various different connections and/or links.

In another embodiment (not shown), the NVLink 1210 provides one or more high-speed communication links between each of the parallel processing unit modules (parallel processing unit 1202, parallel processing unit 1202, parallel processing unit 1202, and parallel processing unit 1202) and the central processing unit 1206 and the switch 1208 interfaces between the interconnect 1212 and each of the parallel processing unit modules. The parallel processing unit modules, memory 1204 modules, and interconnect 1212 may be situated on a single semiconductor platform to form a parallel processing module 1214. In yet another embodiment (not shown), the interconnect 1212 provides one or more communication links between each of the parallel processing unit modules and the central processing unit 1206 and the switch 1208 interfaces between each of the parallel processing unit modules using the NVLink 1210 to provide one or more high-speed communication links between the parallel processing unit modules. In another embodiment (not shown), the NVLink 1210 provides one or more high-speed communication links between the parallel processing unit modules and the central processing unit 1206 through the switch 1208. In yet another embodiment (not shown), the interconnect 1212 provides one or more communication links between each of the parallel processing unit modules directly. One or more of the NVLink 1210 high-speed communication links may be implemented as a physical NVLink interconnect or either an on-chip or on-die interconnect using the same protocol as the NVLink 1210.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1214 may be implemented as a circuit board substrate and each of the parallel processing unit modules and/or memory 1204 modules may be packaged devices. In an embodiment, the central processing unit 1206, switch 1208, and the parallel processing module 1214 are situated on a single semiconductor platform.

In an embodiment, the signaling rate of each NVLink 1210 is 20 to 25 Gigabits/second and each parallel processing unit module includes six NVLink 1210 interfaces (as shown in FIG. 12, five NVLink 1210 interfaces are included for each parallel processing unit module). Each NVLink 1210 provides a data transfer rate of 25 Gigabytes/second in each direction, with six links providing 300 Gigabytes/second. The NVLink 1210 can be used exclusively for PPU-to-PPU communication as shown in FIG. 12, or some combination of PPU-to-PPU and PPU-to-CPU, when the central processing unit 1206 also includes one or more NVLink 1210 interfaces.

In an embodiment, the NVLink 1210 allows direct load/store/atomic access from the central processing unit 1206 to each parallel processing unit module's memory 1204. In an embodiment, the NVLink 1210 supports coherency operations, allowing data read from the memory 1204 modules to be stored in the cache hierarchy of the central processing unit 1206, reducing cache access latency for the central processing unit 1206. In an embodiment, the NVLink 1210 includes support for Address Translation Services (ATS), enabling the parallel processing unit module to directly access page tables within the central processing unit 1206. One or more of the NVLink 1210 may also be configured to operate in a low-power mode.

Graphics Processing Pipeline

Figure 13:
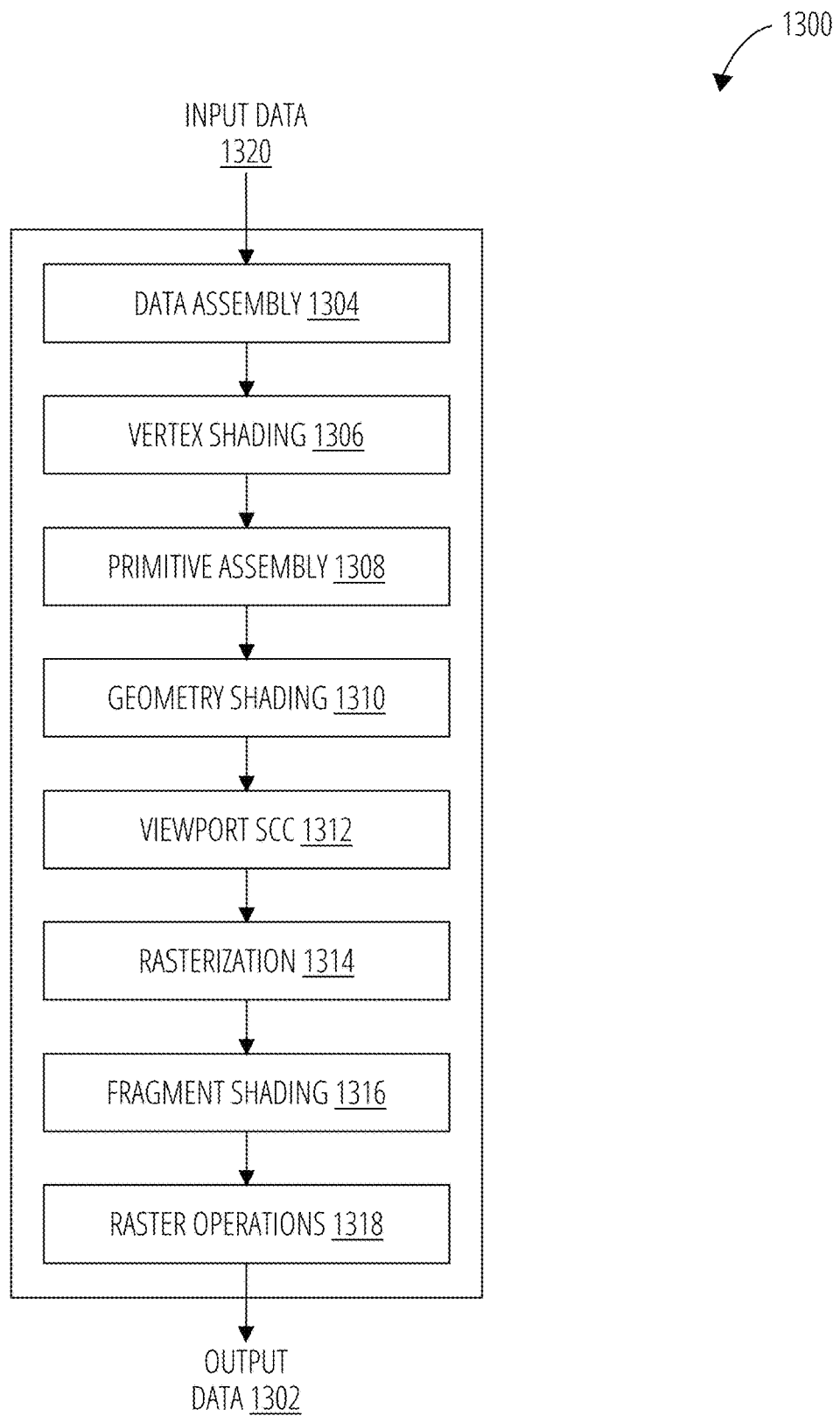
FIG. 13 depicts a graphics processing pipeline 1300 in accordance with one embodiment.

FIG. 13 is a conceptual diagram of a graphics processing pipeline 1300 implemented by the parallel processing unit 802 of FIG. 8, in accordance with an embodiment. In an embodiment, the parallel processing unit 802 comprises a graphics processing unit (GPU). The parallel processing unit 802 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 802 may be configured to process the graphics primitives to generate a frame buffer (e.g., pixel data for each of the pixels of the display).

An application writes model data for a scene (e.g., a collection of vertices and attributes) to a memory such as a system memory or memory 804. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the streaming multiprocessors 1100 of the parallel processing unit 802 including one or more of a vertex shader, hull shader, domain shader, geometry shader, and a pixel shader. For example, one or more of the streaming multiprocessor 1100 modules may be configured to execute a vertex shader program that processes a number of vertices defined by the model data. In an embodiment, the different streaming multiprocessor 1100 modules may be configured to execute different shader programs concurrently. For example, a first subset of streaming multiprocessors 914 may be configured to execute a vertex shader program while a second subset of streaming multiprocessors 914 may be configured to execute a pixel shader program. The first subset of streaming multiprocessors 914 processes vertex data to produce processed vertex data and writes the processed vertex data to the level two cache 1004 and/or the memory 804. After the processed vertex data is rasterized (e.g., transformed from three-dimensional data into two-dimensional data in screen space) to produce fragment data, the second subset of streaming multiprocessors 1100 modules executes a pixel shader to produce processed fragment data, which is then blended with other processed fragment data and written to the frame buffer in memory 804. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 1300 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1300 receives input data 601 that is transmitted from one stage to the next stage of the graphics processing pipeline 1300 to generate output data 1302. In an embodiment, the graphics processing pipeline 1300 may represent a graphics processing pipeline defined by the OpenGL R API. As an option, the graphics processing pipeline 1300 may be implemented in the context of the functionality and architecture of the previous Figures and/or any subsequent Figure(s).

As shown in FIG. 13, the graphics processing pipeline 1300 comprises a pipeline architecture that includes a number of stages. The stages include, but are not limited to, a data assembly 1304 stage, a vertex shading 1306 stage, a primitive assembly 1308 stage, a geometry shading 1310 stage, a viewport SCC 1312 stage, a rasterization 1314 stage, a fragment shading 1316 stage, and a raster operations 1318 stage. In an embodiment, the input data 1320 comprises commands that configure the processing units to implement the stages of the graphics processing pipeline 1300 and geometric primitives (e.g., points, lines, triangles, quads, triangle strips or fans, etc.) to be processed by the stages. The output data 1302 may comprise pixel data (e.g., color data) that is copied into a frame buffer or other type of surface data structure in a memory.

The data assembly 1304 stage receives the input data 1320 that specifies vertex data for high-order surfaces, primitives, or the like. The data assembly 1304 stage collects the vertex data in a temporary storage or queue, such as by receiving a command from the host processor that includes a pointer to a buffer in memory and reading the vertex data from the buffer. The vertex data is then transmitted to the vertex shading 1306 stage for processing.

The vertex shading 1306 stage processes vertex data by performing a set of operations (e.g., a vertex shader or a program) once for each of the vertices. Vertices may be, e.g., specified as a 4-coordinate vector (e.g., $<x, y, z, w>$) associated with one or more vertex attributes (e.g., color, texture coordinates, surface normal, etc.). The vertex shading 1306 stage may manipulate individual vertex attributes such as position, color, texture coordinates, and the like. In other words, the vertex shading 1306 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 1306 stage generates transformed vertex data that is transmitted to the primitive assembly 1308 stage.

The primitive assembly 1308 stage collects vertices output by the vertex shading 1306 stage and groups the vertices into geometric primitives for processing by the geometry shading 1310 stage. For example, the primitive assembly 1308 stage may be configured to group every three consecutive vertices as a geometric primitive (e.g., a triangle) for transmission to the geometry shading 1310 stage. In some embodiments, specific vertices may be reused for consecutive geometric primitives (e.g., two consecutive triangles in a triangle strip may share two vertices). The primitive assembly 1308 stage transmits geometric primitives (e.g., a collection of associated vertices) to the geometry shading 1310 stage.

The geometry shading 1310 stage processes geometric primitives by performing a set of operations (e.g., a geometry shader or program) on the geometric primitives. Tessellation operations may generate one or more geometric primitives from each geometric primitive. In other words, the geometry shading 1310 stage may subdivide each geometric primitive into a finer mesh of two or more geometric primitives for processing by the rest of the graphics processing pipeline 1300. The geometry shading 1310 stage transmits geometric primitives to the viewport SCC 1312 stage.

In an embodiment, the graphics processing pipeline 1300 may operate within a streaming multiprocessor and the vertex shading 1306 stage, the primitive assembly 1308 stage, the geometry shading 1310 stage, the fragment shading 1316 stage, and/or hardware/software associated therewith, may sequentially perform processing operations. Once the sequential processing operations are complete, in an embodiment, the viewport SCC 1312 stage may utilize the data. In an embodiment, primitive data processed by one or more of the stages in the graphics processing pipeline 1300 may be written to a cache (e.g. L1 cache, a vertex cache, etc.). In this case, in an embodiment, the viewport SCC 1312 stage may access the data in the cache. In an embodiment, the viewport SCC 1312 stage and the rasterization 1314 stage are implemented as fixed function circuitry.

The viewport SCC 1312 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 1314 stage.

The rasterization 1314 stage converts the 3D geometric primitives into 2D fragments (e.g. capable of being utilized for display, etc.). The rasterization 1314 stage may be configured to utilize the vertices of the geometric primitives to setup a set of plane equations from which various attributes can be interpolated. The rasterization 1314 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 1314 stage generates fragment data (e.g., interpolated vertex attributes associated with a particular sample location for each covered pixel) that are transmitted to the fragment shading 1316 stage.

The fragment shading 1316 stage processes fragment data by performing a set of operations (e.g., a fragment shader or a program) on each of the fragments. The fragment shading 1316 stage may generate pixel data (e.g., color values) for the fragment such as by performing lighting operations or sampling texture maps using interpolated texture coordinates for the fragment. The fragment shading 1316 stage generates pixel data that is transmitted to the raster operations 1318 stage.

The raster operations 1318 stage may perform various operations on the pixel data such as performing alpha tests, stencil tests, and blending the pixel data with other pixel data corresponding to other fragments associated with the pixel. When the raster operations 1318 stage has finished processing the pixel data (e.g., the output data 1302), the pixel data may be written to a render target such as a frame buffer, a color buffer, or the like.

It will be appreciated that one or more additional stages may be included in the graphics processing pipeline 1300 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 1310 stage). Other types of graphics processing pipelines are contemplated as being within the scope of the present disclosure. Furthermore, any of the stages of the graphics processing pipeline 1300 may be implemented by one or more dedicated hardware units within a graphics processor such as parallel processing unit 802. Other stages of the graphics processing pipeline 1300 may be implemented by programmable hardware units such as the streaming multiprocessors 914 of the parallel processing unit 802.

The graphics processing pipeline 1300 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 802. The API provides an abstraction for a programmer that lets a programmer utilize specialized graphics hardware, such as the parallel processing unit 802, to generate the graphical data without requiring the programmer to utilize the specific instruction set for the parallel processing unit 802. The application may include an API call that is routed to the device driver for the parallel processing unit 802. The device driver interprets the API call and performs various operations to respond to the API call. In some instances, the device driver may perform operations by executing instructions on the CPU. In other instances, the device driver may perform operations, at least in part, by launching operations on the parallel processing unit 802 utilizing an input/output interface between the CPU and the parallel processing unit 802. In an embodiment, the device driver is configured to implement the graphics processing pipeline 1300 utilizing the hardware of the parallel processing unit 802.

Various programs may be executed within the parallel processing unit 802 in order to implement the various stages of the graphics processing pipeline 1300. For example, the device driver may launch a kernel on the parallel processing unit 802 to perform the vertex shading 1306 stage on one streaming multiprocessor 1100 (or multiple streaming multiprocessors 1100). The device driver (or the initial kernel executed by the parallel processing unit 802) may also launch other kernels on the parallel processing unit 802 to perform other stages of the graphics processing pipeline 1300, such as the geometry shading 1310 stage and the fragment shading 1316 stage. In addition, some of the stages of the graphics processing pipeline 1300 may be implemented on fixed unit hardware such as a rasterizer or a data assembler implemented within the parallel processing unit 802. It will be appreciated that results from one kernel may be processed by one or more intervening fixed function hardware units before being processed by a subsequent kernel on a streaming multiprocessor 1100.

Machine Embodiments

Figure 14:
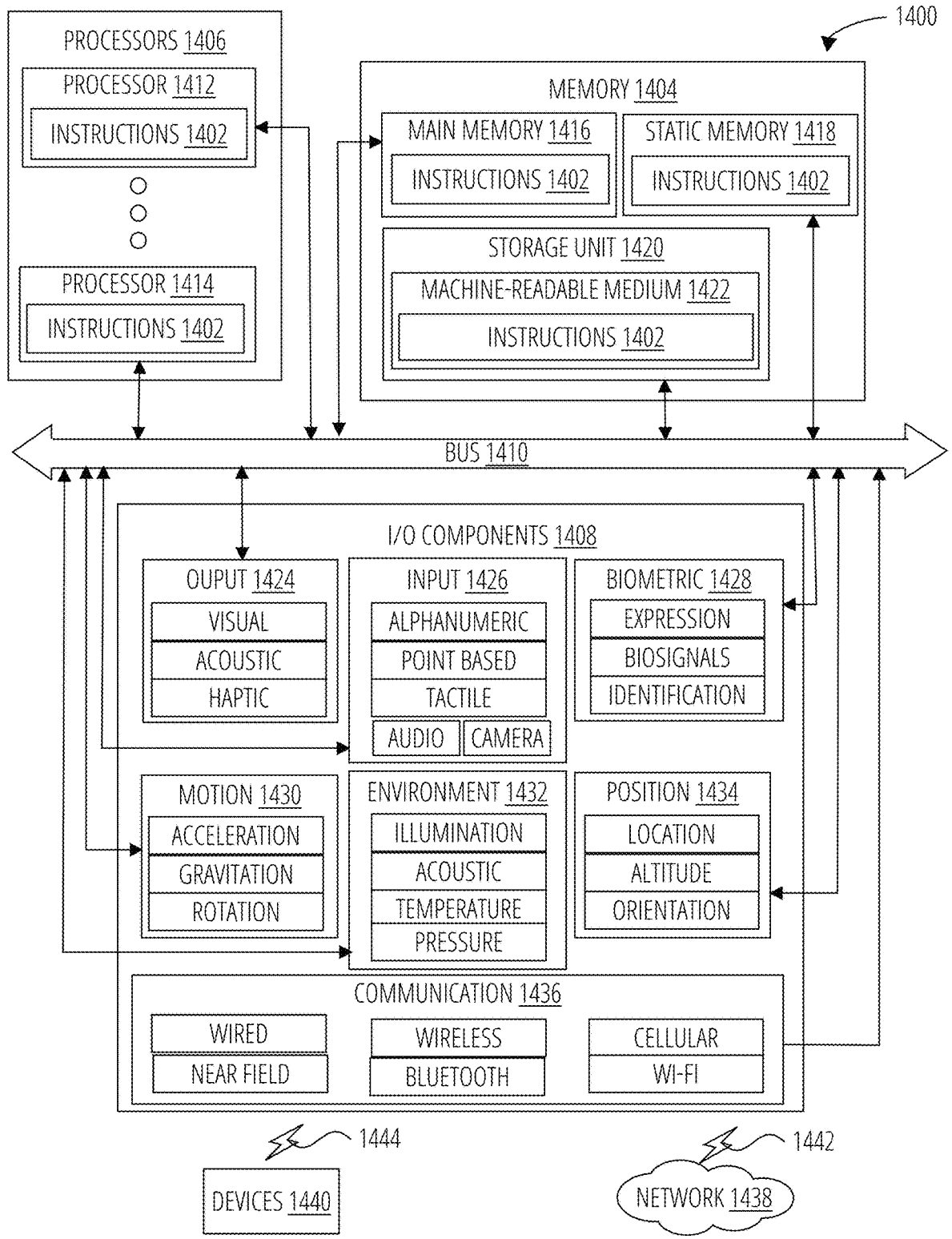
FIG. 14 depicts a machine 1400 in the form of a computer system within which a set of instructions may be executed for causing the machine to perform any one or more of the methodologies discussed herein, according to an example embodiment.

FIG. 14 depicts a diagrammatic representation of a machine 1400 in the form of a computer system within which logic may be implemented to cause the machine to perform any one or more of the functions or methods disclosed herein, according to an example embodiment.

Specifically, FIG. 14 depicts a machine 1400 comprising instructions 1402 (e.g., a program, an application, an applet, an app, or other executable code) for causing the machine 1400 to execute various functions. The instructions 1402 configure a general, non-programmed machine into a particular machine 1400 programmed to carry out said functions and/or methods.

The machine 1400 includes various components (e.g., memories 1404, processors 1406) that may exchange data and/or commands in accordance with the techniques described herein.

In alternative embodiments, the machine 1400 operates as a standalone device or may be coupled (e.g., networked) to other machines. In a networked deployment, the machine 1400 may operate in the capacity of a server machine or a client machine in a server-client network environment, or as a peer machine in a peer-to-peer (or distributed) network environment. The machine 1400 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1402, sequentially or otherwise, that specify actions to be taken by the machine 1400. Further, while only a single machine 1400 is depicted, the term "machine" shall also be taken to include a collection of machines that individually or jointly execute the instructions 1402 to perform any one or more of the methodologies or subsets thereof discussed herein.

The machine 1400 may include processors 1406, memory 1404, and I/O components 1408, which may be configured to communicate with each other such as via one or more bus 1410. In an example embodiment, the processors 1406 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, one or more processor (e.g., processor 1412 and processor 1414) to execute the instructions 1402. The term "processor" is intended to include multi-core processors that may comprise two or more independent processors (sometimes referred to as "cores") that may execute instructions contemporaneously. Although FIG. 14 depicts multiple processors 1406, the machine 1400 may include a single processor with a single core, a single processor with multiple cores (e.g., a multi-core processor), multiple processors with a single core, multiple processors with multiples cores, or any combination thereof.

The memory 1404 may include one or more of a main memory 1416, a static memory 1418, and a storage unit 1420, each accessible to the processors 1406 such as via the bus 1410. The main memory 1416, the static memory 1418, and storage unit 1420 may be utilized, individually or in combination, to store the instructions 1402 embodying any one or more of the functionality described herein. The instructions 1402 may reside, completely or partially, within the main memory 1416, within the static memory 1418, within a machine-readable medium 1422 within the storage unit 1420, within at least one of the processors 1406 (e.g., within the processor's cache memory), or any suitable combination thereof, during execution thereof by the machine 1400.

The I/O components 1408 may include a wide variety of components to receive input, provide output, produce output, transmit information, exchange information, capture measurements, and so on. The specific I/O components 1408 that are included in a particular machine will depend on the type of machine. For example, portable machines such as mobile phones will likely include a touch input device or other such input mechanisms, while a headless server machine will likely not include such a touch input device. It will be appreciated that the I/O components 1408 may include many other components that are not shown in FIG. 14. The I/O components 1408 are grouped according to functionality merely for simplifying the following discussion and the grouping is in no way limiting. In various example embodiments, the I/O components 1408 may include output components 1424 and input components 1426. The output components 1424 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1426 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), one or more cameras for capturing still images and video, and the like.

In further example embodiments, the I/O components 1408 may include biometric components 1428, motion components 1430, environmental components 1432, or position components 1434, among a wide array of possibilities. For example, the biometric components 1428 may include components to detect expressions (e.g., hand expressions, facial expressions, vocal expressions, body gestures, or eye tracking), measure bio-signals (e.g., blood pressure, heart rate, body temperature, perspiration, or brain waves), identify a person (e.g., voice identification, retinal identification, facial identification, fingerprint identification, or electroencephalogram-based identification), and the like. The motion components 1430 may include acceleration sensor components (e.g., accelerometer), gravitation sensor components, rotation sensor components (e.g., gyroscope), and so forth. The environmental components 1432 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1434 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1408 may include communication components 1436 operable to couple the machine 1400 to a network 1438 or devices 1440 via a coupling 1442 and a coupling 1444, respectively. For example, the communication components 1436 may include a network interface component or another suitable device to interface with the network 1438. In further examples, the communication components 1436 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1440 may be another machine or any of a wide variety of peripheral devices (e.g., a peripheral device coupled via a USB).

Moreover, the communication components 1436 may detect identifiers or include components operable to detect identifiers. For example, the communication components 1436 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1436, such as location via Internet Protocol (IP) geolocation, location via Wi-Fi® signal triangulation, location via detecting an NFC beacon signal that may indicate a particular location, and so forth.

Instruction and Data Storage Medium Embodiments

The various memories (i.e., memory 1404, main memory 1416, static memory 1418, and/or memory of the processors 1406) and/or storage unit 1420 may store one or more sets of instructions and data structures (e.g., software) embodying or utilized by any one or more of the methodologies or functions described herein. These instructions (e.g., the instructions 1402), when executed by processors 1406, cause various operations to implement the disclosed embodiments.

As used herein, the terms "machine-storage medium," "device-storage medium," "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors and internal or external to computer systems. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such intangible media, at least some of which are covered under the term "signal medium" discussed below.

Some aspects of the described subject matter may in some embodiments be implemented as computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular data structures in memory. The subject matter of this application may be practiced in a variety of system configurations, including hand-held devices, consumer electronics, general-purpose computers, more specialty computing devices, etc. The subject matter may also be practiced in distributed computing environments where tasks are performed by remote-processing devices that are linked through a communications network.

Communication Network Embodiments

In various example embodiments, one or more portions of the network 1438 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 1438 or a portion of the network 1438 may include a wireless or cellular network, and the coupling 1442 may be a Code Division Multiple Access (CDMA) connection, a Global System for Mobile communications (GSM) connection, or another type of cellular or wireless coupling. In this example, the coupling 1442 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 1402 and/or data generated by or received and processed by the instructions 1402 may be transmitted or received over the network 1438 using a transmission medium via a network interface device (e.g., a network interface component included in the communication components 1436) and utilizing any one of a number of well-known transfer protocols (e.g., hypertext transfer protocol (HTTP)). Similarly, the instructions 1402 may be transmitted or received using a transmission medium via the coupling 1444 (e.g., a peer-to-peer coupling) to the devices 1440. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 1402 for execution by the machine 1400, and/or data generated by execution of the instructions 1402, and/or data to be operated on during execution of the instructions 1402, and includes digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a matter as to encode information in the signal.

Figure 15:
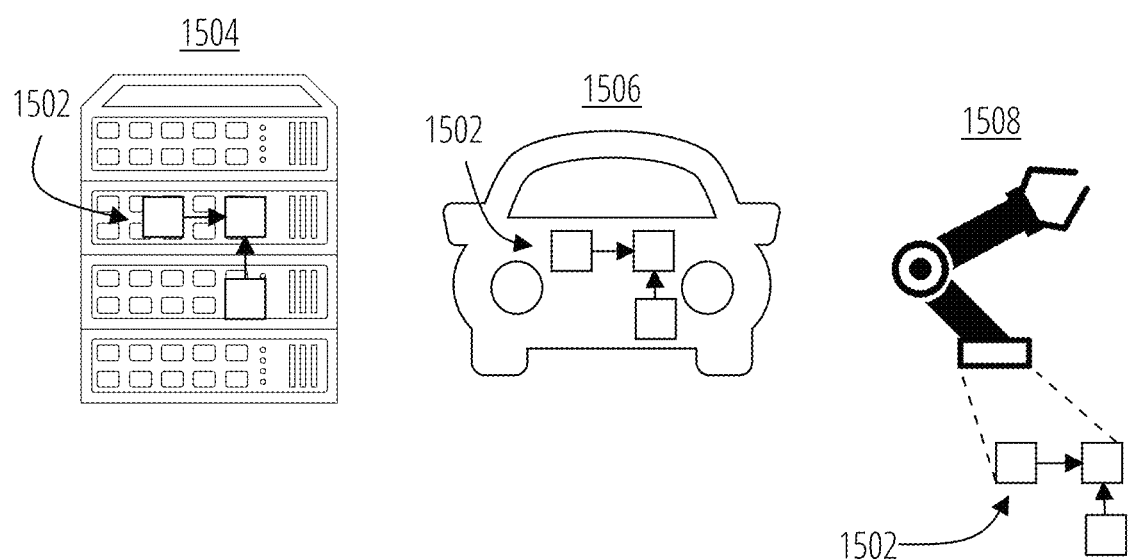
FIG. 15 depicts a circuit system 1502 in accordance with one embodiment.

FIG. 15 depicts exemplary scenarios for use of a circuit system 1502 in accordance with some embodiments. A circuit system 1502 may be utilized in a computing system 1504 (e.g., a data center computer or computers), a vehicle 1506, and a robot 1508, to name just a few examples. The circuit system 1502 may comprise a PAM-3 transmitter communicating data and/or instructions to a receiver, for example.

LISTING OF DRAWING ELEMENTS

100 data communication system
102 data processor
104 processing core
106 PAM-3 symbol encoder
108 PAM-3 transmitter
110 memory
112 memory bus
114 PAM-3 receiver 116 PAM-3 symbol decoder
118 internal data bus
200 PAM-3 transceiver
202 least significant bit transmitter
204 most significant bit transmitter
206 receiver
208 data lane
302 transmitter
304 receiver
400 burst read system
402 data burst
404 DQ/DQX/DQY encoder
406 EDC encoder
408 PAM-3 encoding
410 PAM-3 encoding
500 machine memory system
502 CRC checker
504 DRAM
506 DQE decoder
508 CRC generator
510 DQE encoder
700 logic
802 parallel processing unit
804 memory
806 crossbar
808 I/O unit
810 front-end unit
812 scheduler unit
814 work distribution unit
816 hub
818 general processing cluster
820 memory partition unit
822 NVLink
824 interconnect
900 general processing cluster
902 pipeline manager
904 pre-raster operations unit
906 raster engine
908 work distribution crossbar
910 memory management unit
912 data processing cluster
914 streaming multiprocessor
916 primitive engine
918 M-pipe controller
920 crossbar
1000 memory partition unit
1002 raster operations unit
1004 level two cache
1006 memory interface
1008 memory
1010 crossbar
1100 streaming multiprocessor
1102 instruction cache
1104 scheduler unit
1106 register file
1108 core
1110 special function unit
1112 load/store unit
1114 interconnect network
1116 shared memory/L1 cache
1118 dispatch
1120 memory management unit
1200 processing system
1202 parallel processing unit
1204 memory
1206 central processing unit
1208 switch
1210 NVLink
1212 interconnect
1214 parallel processing module
1300 graphics processing pipeline
1302 output data
1304 data assembly
1306 vertex shading
1308 primitive assembly
1310 geometry shading
1312 viewport SCC
1314 rasterization
1316 fragment shading
1318 raster operations
1320 input data
1400 machine
1402 instructions
1404 memory
1406 processors
1408 I/O components
1410 bus
1412 processor
1414 processor
1416 main memory
1418 static memory
1420 storage unit
1422 machine-readable medium
1424 output components
1426 input components
1428 biometric components
1430 motion components
1432 environmental components
1434 position components
1436 communication components
1438 network
1440 devices
1442 coupling
1444 coupling
1502 circuit system
1504 computing system
1506 vehicle
1508 robot

---

LISTING I

```
// ENCODER ALGORITHM
module pam3enc_srs_v2 (  input logic [10:0] x,   output logic
[13:0] y );
logic [4:0]   s;
logic [13:0]  mask;
reg [13:0]   y_loc;
logic [9:0]  lmask;
reg [3:0]   sum;
always_comb begin
    // default mask for the easy to encode types
    //mask = {4'b0000,8'b00000000,1'b0,x[10]};
    // flags to determine invalid 2'b10 symbols
    s[4] = (2'b10 == x[9:8]);
    s[3] = (2'b10 == x[7:6]);
    s[2] = (2'b10 == x[5:4]);
    s[1] = (2'b10 == x[3:2]);
    s[0] = (2'b10 == x[1:0]);
 sum = s[0]+s[1]+s[2]+s[3]+s[4];
 // set bits that have invalid symbols to 2'b00
    y_loc[1:0] = s[0] ? 2'b00 : x[1:0];
    y_loc[3:2] = s[1] ? 2'b00 : x[3:2];
    y_loc[5:4] = s[2] ? 2'b00 : x[5:4];
    y_loc[7:6] = s[3] ? 2'b00 : x[7:6];
    y_loc[9:8] = s[4] ? 2'b00 : x[9:8];
    y_loc[13:10] = 4'b0000;
```

LISTING I

```
        // outlier case
            if(s == 5'b00101)   // need to shift bits
                y_loc =
{y_loc[13:10],y_loc[9:8],y_loc[5:4],y_loc[7:6],y_loc[3:0]};
            unique case(sum)
                3'b000 :   lmask = 10'b00000000;
                3'b001 :   lmask = {8'b00000000,1'b0,x[10]};
                3'b010 :   lmask = {6'b000000,1'b0,x[10],2'b11};
                3'b011 :   lmask = {4'b0000,1'b0,x[10],4'b1111};
                3'b100 :   lmask = {2'b00,1'b0,x[10],6'b111111};
                3'b101 :   lmask = {1'b0,x[10],8'b11111111};
            endcase
            if(sum == 0)    mask = {3'b000,x[10],lmask};
            if((s[0] & ~s[4]) | sum == 5)   mask = {4'b0011, lmask};
            if(s[1] & ~s[0]) mask = {4'b0100, (lmask << 2) ^ (lmask >> 8)};
            if(s[2] & ~s[1])   mask = {4'b0101, (lmask << 4) ^ (lmask >> 6)};
            if(s[3] & ~s[2])   mask = {4'b0111, (lmask << 6) ^ (lmask >> 4)};
            if(s[4] & ~s[3])   mask = {4'b1100, (lmask << 8) ^ (lmask >> 2)};
        case (s)
            5'b01001: mask = {4'b1101,2'b00,2'b00,4'b0000,1'b0,x[10]};
            5'b01011: mask ={4'b1101,2'b00,2'b01,2'b00,1'b0,x[10],2'b00};
            5'b01101: mask = {4'b1101,2'b00,2'b01,1'b0,x[10],2'b00,2'b01};
            5'b00101: mask = {4'b1101,2'b00,1'b0,x[10],4'b0000,2'b11};
            5'b01010: mask = {4'b1101,2'b00,2'b11,2'b00,1'b0,x[10],2'b00};
            5'b11010: mask = {4'b1111,2'b11,1'b0,x[10],2'b00,2'b11,2'b00};
            5'b10010: mask = {4'b1111,2'b11,4'b0000,1'b0,x[10],2'b00};
            5'b10100: mask = {4'b1111,2'b01,2'b00,1'b0,x[10],4'b0000};
            5'b10110: mask ={4'b1111,2'b00,2'b00,2'b01,1'b0,x[10],2'b00};
            5'b10101: mask = {4'b1111,2'b00,2'b00,2'b11,2'b00,1'b0,x[10]};
        endcase
        // xor mask and modified data
            y[13:0] = y_loc[13:0] ^ mask;
        end
endmodule
```

LISTING II

```
// DECODER ALGORITHM
module pam3dec_srs_v2 (  input logic [13:0] y,   output logic
[10:0] x1 );
always_comb begin
x1 = 10'b0;
unique casez(y[13:10])
        4'b000? : x1 = y[10:0];
        4'b0011 :
            unique casez({y[7],y[5],y [3],y[1]})
                4'b???0 : x1 = {y[0],y[9:2],2'b10};
                4'b??01 : x1 = {y[2],y[9:4],4'b1010};
                4'b?011 : x1 = {y[4],y[9:6],6'b101010};
                4'b0111 : x1 = {y[6],y[9:8],8'b10101010};
                4'b1111 : x1 = {y[8],10'b1010101010};
            endcase
        4'b0100 :
            unique casez({y[9],y[7],y[5],y[3]})
                4'b???0 : x1 = {y[2],y[9:4],2'b10,y[1:0]};
                4'b??01 : x1 = {y[4],y[9:6],4'b1010,y[1:0]};
                4'b?011 : x1 = {y[6],y[9:8],6'b101010,y[1:0]};
                4'b0111 : x1 = {y[8],8'b10101010,y[1:0]};
            endcase
        4'b0101 :
            unique casez({y[1],y[9],y[7],y[5]})
                4'b???0 : x1 = {y[4],y[9:6],2'b10,y[3:0]};
                4'b??01 : x1 = {y[6],y[9:8],4'b1010,y[3:0]};
                4'b?011 : x1 = {y[8],6'b101010,y[3:0]};
                4'b0111 : x1 = {y[0],6'b101010,y[3:2],2'b10};
            endcase
        4'b0111 :
            unique casez({y[3],y[1],y[9],y[7]})
                4'b???0 : x1 = {y[6],y[9:8],2'b10,y[5:0]};
                4'b??01 : x1 = {y[8],4'b1010,y[5:0]};
                4'b?011 : x1 = {y[0],4'b1010,y[5:2],2'b10};
                4'b0111 : x1 = {y[2],4'b1010,y[5:4],4'b1010};
            endcase
        4'b1100 :
            unique casez({y[5],y[3],y[1],y[9]})
                4'b???0 : x1 = {y[8],2'b10,y[7:0]};
                4'b??01 : x1 = {y[0],2'b10,y[7:2],2'b10};
                4'b?011 : x1 = {y[2],2'b10,y[7:4],4'b1010};
                4'b0111 : x1 = {y[4],2'b10,y[7:6],6'b101010};
            endcase
        4'b1101 :
            unique casez({y[7:6],y[1:0]})
                4'b0000? : x1 = {y[0],y[9:8],2'b10,y[5:2],2'b10};
                4'b0100 : x1 = {y[2],y[9:8],2'b10,y[5:4],4'b1010};
                4'b0101 : x1 = {y[4],y[9:8],4'b1010,y[3:2],2'b10};
                4'b0?11 : x1 = {y[6],y[9:8],y[5:4],2'b10,y[3:2],2'b10};
                4'b11?? : x1 = {y[2],y[9:8],2'b10,y[5:4],2'b10,y[1:0]};
            endcase
        4'b1111 :
            unique casez({y[9:8],y[5:4],y[3:2]})
                6'b01???? : x1 = {y[4],2'b10,y[7:6],2'b10,y[3:0]};
                6'b11??0? : x1 = {y[2],2'b10,y[7:4],2'b10,y[1:0]};
                6'b11??1? : x1 = {y[6],4'b1010,y[5:4],2'b10,y[1:0]};
                6'b0001?? : x1 = {y[2],2'b10,y[7:6],4'b1010,y[1:0]};
                6'b001??? : x1 = {y[0],2'b10,y[7:6],2'b10,y[3:2],2'b10};
            endcase
    endcase
  end
endmodule
```

Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112 (f) for that claim element. Accordingly, claims in this application that do not otherwise include the "means for" [performing a function] construct should not be interpreted under 35 U.S.C. § 112 (f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A transceiver configured to communicate a burst of data bits and meta-data bits for the data bits, the transceiver comprising:
   a plurality of communication channels comprising a plurality of data channels, a plurality of auxiliary data channels, and an error correction channel;
   an encoder configured to:
      apply 11b7s encoding to at least some of the data bits to generate first PAM-3 symbols on each of the plurality of communication channels; and
      apply 11b7s encoding to a combination of 3 of the data bits and 8 bits of a cyclic redundancy check (CRC) value comprised by the meta-data bits to generate a first set of 7 PAM-3 symbols on the error correction channel.

2. The transceiver of claim 1, wherein the plurality of communication channels consist of eight data channels, two auxiliary data channels, and the error correction channel.

3. The transceiver of claim 1, wherein the burst of data bits consists of 256 data bits.

4. The transceiver of claim 1, wherein the meta-data bits consist of the CRC value and one or both of a poison bit and a severity bit, and the encoder is further configured to apply 11b7s encoding to the meta-data bits to generate second PAM-3 symbols on the error correction channel.

5. The transceiver of claim 1, the encoder further configured to apply 11b7s encoding to a combination of 10 bits of the CRC value and either a poison bit or a severity bit to generate a second set of 7 PAM-3 symbols on the error correction channel.

6. A transceiver configured to communicate a burst of data bits and meta-data bits for the data bits, the transceiver comprising:
   a plurality of communication channels comprising a plurality of data channels, a plurality of auxiliary data channels, and an error correction channel;
   a decoder configured to:
      apply 11b7s decoding to recover at least some of the data bits from first PAM-3 symbols on each of the plurality of communication channels; and
      apply 11b7s decoding to a first set of 7 PAM-3 symbols on the error correction channel to recover 3 of the data bits and 8 bits of a cyclic redundancy check (CRC) value.

7. The transceiver of claim 6, wherein the plurality of communication channels consist of eight data channels, two auxiliary data channels, and the error correction channel.

8. The transceiver of claim 6, wherein the burst of data bits consists of 256 data bits.

9. The transceiver of claim 6, wherein the meta-data bits consist of the CRC value and one or both of a poison bit and a severity bit, and the decoder is further configured to apply 11b7s decoding to the meta-data bits to recover one or both of the poison bit and the severity bit on the error correction channel.

10. The transceiver of claim 6, the decoder further configured to apply 11b7s decoding to a second set of 7 PAM-3 symbols on the error correction channel to recover 10 bits of the CRC value and either a poison bit or a severity bit.

11. A method of communicating data bits and meta-data bits in a device, the method comprising:

communicating the data bits in a burst over a plurality of communication channels comprising a plurality of data channels, a plurality of auxiliary data channels, and an error correction channel;

operating an 11b7s encoder on at least some of the data bits to generate first PAM-3 symbols on each of the data channels, auxiliary data channels, and the error correction channel; and operating the 11b7s encoder on a combination of 10 bits of a cyclic redundancy check (CRC) of the meta-data bits and either a poison bit or a severity bit of the meta-data bits to generate a first set of 7 PAM-3 symbols on the error correction channel.

12. The method of claim 11, wherein the plurality of communication channels consist of eight data channels, two auxiliary data channels, and the error correction channel.

13. The method of claim 11, wherein the burst of data bits consists of 256 data bits.

14. The method of claim 11, further comprising:

operating the 11b7s encoder on a combination of 3 of the data bits and 8 bits of the CRC to generate a second set of 7 PAM-3 symbols on the error correction channel.

15. A system comprising:

a machine memory;

a data processor;

a memory bus coupling the machine memory to the data processor, the memory bus comprising eight data channels, two auxiliary data channels, and one error correction channel;

an encoder configured to apply 11b7s encoding to a burst of data bits to communicate over the memory bus to generate first PAM-3 symbols on each of eight data channels, two auxiliary data channels, and one error correction channel;

the encoder configured to apply 11b7s encoding to a combination of 3 of the data bits and 8 bits of a cyclic redundancy check (CRC) to generate a first set of 7 PAM-3 symbols on the error correction channel; and the encoder configured to apply 11b7s encoding to a combination of 10 bits of the CRC and either a poison bit or a severity bit to generate a second set of 7 PAM-3 symbols on the error correction channel.

16. The system of claim 15, the encoder further configured generate second PAM-3 symbols on the error correction channel by applying 11b7s encoding to meta-data bits for the data bits, the meta-data bits comprising the CRC and one or both of the poison bit and the severity bit.

* * * * *